(12) United States Patent
Swaminathan

(10) Patent No.: US 10,529,557 B2
(45) Date of Patent: Jan. 7, 2020

(54) SYSTEMS AND METHODS FOR UV-BASED SUPPRESSION OF PLASMA INSTABILITY

(71) Applicant: Lam Research Corporation, Fremont, CA (US)

(72) Inventor: Shankar Swaminathan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/167,382

(22) Filed: Oct. 22, 2018

(65) Prior Publication Data

US 2019/0057864 A1 Feb. 21, 2019

Related U.S. Application Data

(62) Division of application No. 15/261,737, filed on Sep. 9, 2016, now Pat. No. 10,109,478.

(51) Int. Cl.
| | |
|---|---|
| *H01L 21/02* | (2006.01) |
| *C23C 16/40* | (2006.01) |
| *C23C 16/505* | (2006.01) |
| *C23C 16/56* | (2006.01) |
| *C23C 16/509* | (2006.01) |

(52) U.S. Cl.
CPC ...... *H01L 21/02348* (2013.01); *C23C 16/402* (2013.01); *C23C 16/505* (2013.01); *C23C 16/5096* (2013.01); *C23C 16/56* (2013.01); *H01L 21/0228* (2013.01); *H01L 21/02164* (2013.01); *H01L 21/02274* (2013.01)

(58) Field of Classification Search
CPC ............. H01L 29/7869; H01L 27/1225; H01L 29/78696; H01L 29/66969; H01L 29/24
See application file for complete search history.

(56) References Cited

U.S. PATENT DOCUMENTS 5,522,935 A * 6/1996 Sato .................... C23C 16/517
118/715

\* cited by examiner

*Primary Examiner* — Tony Tran
(74) *Attorney, Agent, or Firm* — Penilla IP, APC

(57) ABSTRACT

A substrate is positioned in exposure to a plasma generation region within a plasma processing chamber. A first plasma is generated within the plasma generation region. The first plasma is configured to cause deposition of a film on the substrate until the film deposited on the substrate reaches a threshold film thickness. The substrate is then exposed to ultraviolet radiation to resolve defects within the film deposited on the substrate. The ultraviolet radiation can be supplied in-situ using either a second plasma configured to generate ultraviolet radiation or an ultraviolet irradiation device disposed in exposure to the plasma generation region. The ultraviolet radiation can also be supplied ex-situ by moving the substrate to an ultraviolet irradiation device separate from the plasma processing chamber. The substrate can be exposed to the ultraviolet radiation in a repeated manner to resolve defects within the deposited film as the film thickness increases.

19 Claims, 12 Drawing Sheets

SYSTEMS AND METHODS FOR UV-BASED SUPPRESSION OF PLASMA INSTABILITY

CLAIM OF PRIORITY

This application is a divisional application under 35 U.S.C. 121 of U.S. patent application Ser. No. 15/261,737, filed on Sep. 9, 2016, the disclosure of which is incorporated herein by reference in its entirety for all purposes.

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency and magnitude of the RF power applied, and bias voltage applied to attract charged constituents of the plasma toward the substrate, among others.

However, in some plasma processes, the above-mentioned process parameters may not provide for adequate control of all plasma characteristics and behavior. In particular, in some plasma processes, an instability referred to as a "plasmoid" may occur within the plasma, where the plasmoid is characterized by a small area of higher density plasma surrounded by larger volumes of normal density plasma. The formation of plasmoids can lead to non-uniformity in the processing results on the substrate. Therefore, it is of interest to mitigate and/or control plasmoid formation. It is within this context that the present invention arises.

SUMMARY

In an example embodiment, a method is disclosed for in-situ treatment of film surface defects during a plasma-based film deposition process. The method includes positioning a substrate in exposure to a plasma generation region within a plasma processing chamber. The method also includes generating a first plasma within the plasma generation region. The first plasma is configured to cause deposition of a film on the substrate. The method also includes generating a second plasma within the plasma generation region. The second plasma is configured to emit ultraviolet radiation within the plasma generation region. The substrate is exposed to the ultraviolet radiation. The ultraviolet radiation incident upon the substrate induces a reaction on the substrate to resolve defects within the film on the substrate.

In an example embodiment, a method is disclosed for in-situ treatment of film surface defects during a plasma-based film deposition process. The method includes positioning a substrate in exposure to a plasma generation region within a plasma processing chamber. The method also includes generating a first plasma within the plasma generation region. The first plasma is configured to cause deposition of a film on the substrate. The first plasma is generated until the film deposited on the substrate reaches a threshold film thickness. The method also includes stopping generation of the first plasma and generating a second plasma within the plasma generation region upon the film deposited on the substrate reaching the threshold film thickness. The second plasma is configured to emit ultraviolet radiation within the plasma generation region, with the substrate and film deposited on the substrate being exposed to the ultraviolet radiation. The ultraviolet radiation incident upon the substrate induces a reaction on the substrate to resolve defects within the film on the substrate. The method also includes an operation (a) for stopping generation of the second plasma. The method then proceeds with an operation (b) for resuming generation of the first plasma within the plasma generation region until an interval thickness of the film deposited on the substrate reaches the threshold film thickness. The interval thickness of the film corresponds to a thickness of the film deposited since a most recent stopping of generation of the second plasma. Upon the interval thickness of the film deposited on the substrate reaching the threshold film thickness, the method proceeds with an operation (c) for stopping generation of the first plasma and resuming generation of the second plasma within the plasma generation region, with the ultraviolet radiation from the second plasma resolving defects within the film on the substrate. The method also includes repeating operations (a), (b), and (c) in a successive manner until the film deposited on the substrate reaches a secured film thickness.

In an example embodiment, a method is disclosed for ex-situ treatment of film surface defects during a plasma-based film deposition process. The method includes positioning a substrate in exposure to a plasma generation region within a plasma processing chamber. The method also includes generating a plasma within the plasma generation region. The plasma is configured to cause deposition of a film on the substrate. The plasma is generated until the film deposited on the substrate reaches a threshold film thickness. The method also includes stopping generation of the plasma and moving the substrate to an ultraviolet irradiation device configured to generate ultraviolet radiation upon the film deposited on the substrate reaching the threshold film thickness. The method includes exposing the substrate and film deposited on the substrate to the ultraviolet radiation. The ultraviolet radiation incident upon the substrate induces a reaction on the substrate to resolve defects within the film on the substrate. The method also includes an operation (a) for repositioning the substrate in exposure to the plasma generation region within the plasma processing chamber. The method proceeds with an operation (b) for resuming generation of the plasma within the plasma generation region until an interval thickness of the film deposited on the substrate reaches the threshold film thickness. The interval thickness of the film corresponds to a thickness of the film deposited since a most recent exposure of the substrate to ultraviolet radiation within the ultraviolet irradiation device. Upon the interval thickness of the film deposited on the substrate reaching the threshold film thickness, the method includes an operation (c) for stopping generation of the plasma and moving the substrate to the ultraviolet irradiation device and exposing the substrate and film deposited on the substrate to the ultraviolet radiation to resolve defects within the film on the substrate. The method includes repeating operations (a), (b), and (c) in a successive manner until the film deposited on the substrate reaches a secured film thickness.

In an example embodiment, a method is disclosed for in-situ treatment of film surface defects during a plasma-based film deposition process. The method includes positioning a substrate in exposure to a plasma generation region within a plasma processing chamber. The method also includes generating a plasma within the plasma generation region. The plasma is configured to cause deposition of a film on the substrate. The plasma is generated until the film deposited on the substrate reaches a threshold film thickness. Upon the film deposited on the substrate reaching the threshold film thickness, the method includes stopping generation of the plasma and operating an ultraviolet irradiation device in exposure to the plasma generation region to transmit ultraviolet radiation through the plasma generation region, with the substrate and film deposited on the substrate being exposed to the ultraviolet radiation. The ultraviolet radiation incident upon the substrate induces a reaction on the substrate to resolve defects within the film on the substrate. The method then proceeds with an operation (a) for stopping operation of the ultraviolet irradiation device. The method then proceeds with an operation (b) for resuming generation of the plasma within the plasma generation region until an interval thickness of the film deposited on the substrate reaches the threshold film thickness. The interval thickness of the film corresponds to a thickness of the film deposited since a most recent stopping of operation of the ultraviolet irradiation device. Upon the interval thickness of the film deposited on the substrate reaching the threshold film thickness, the method proceeds with an operation (c) for stopping generation of the plasma and resuming operation of the ultraviolet irradiation device in exposure to the plasma generation region to transmit ultraviolet radiation through the plasma generation region to resolve defects within the film on the substrate. The method includes repeating operations (a), (b), and (c) in a successive manner until the film deposited on the substrate reaches a secured film thickness.

In an example embodiment, an apparatus for in-situ treatment of film surface defects during a plasma-based film deposition process is disclosed. The apparatus includes a substrate support having a top surface configured to support a substrate during a plasma processing operation to deposit a film on the substrate. The apparatus also includes an electrode disposed to transmit radiofrequency power into a plasma generation region overlying the substrate support. The apparatus also includes a process gas delivery component configured to deliver a process gas to the plasma generation region. The apparatus also includes an exhaust outlet configured to exhaust gases from the plasma generation region. The apparatus also includes an ultraviolet irradiation device disposed to transmit ultraviolet radiation through the plasma generation region in a direction toward a top surface of the substrate support.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Deposition of films can be implemented in a plasma enhanced chemical vapor deposition (PECVD) system. The PECVD system may take many different forms. The PECVD system includes one or more chambers or "reactors" (sometimes including multiple stations) that house one or more substrates and are suitable for substrate processing. Each chamber may house one or more substrates for processing. The one or more chambers maintain the substrate in a defined position or positions (with or without motion within that position, e.g. rotation, vibration, or other agitation). A substrate undergoing deposition may be transferred from one station to another within a reactor chamber during the process. Of course, the film deposition may occur entirely at a single station or any fraction of the film may be deposited at any number of stations. While in process, each substrate is held in place by a pedestal, substrate chuck and/or other substrate holding apparatus. For certain operations, the apparatus may include a heater such as a heating plate to heat the substrate.

In an example embodiment, the term substrate as used herein refers to a semiconductor wafer. Also, in various embodiments, the substrate as referred to herein may vary in form, shape, and/or size. For example, in some embodiments, the substrate as referred to herein may correspond to a 200 mm (millimeters) semiconductor wafer, a 300 mm semiconductor wafer, or a 450 mm semiconductor wafer. Also, in some embodiments, the substrate as referred to herein may correspond to a non-circular substrate, such as a rectangular substrate for a flat panel display, or the like, among other shapes.

Figure 1A:
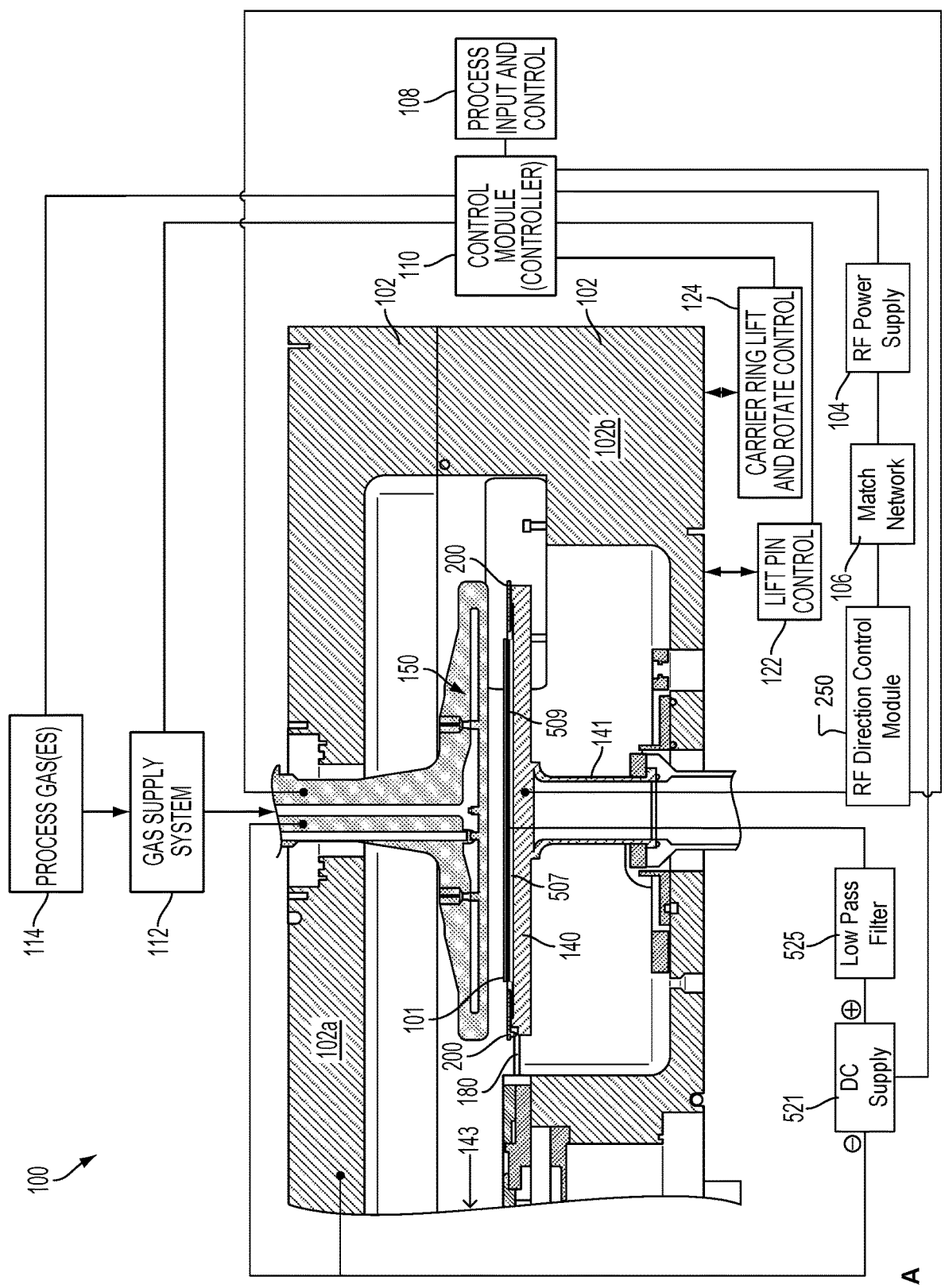
FIG. 1A illustrates a substrate processing system, in accordance with some embodiments of the present invention.

FIG. 1A illustrates a substrate processing system 100, which is used to process a substrate 101, in accordance with some embodiments of the present invention. The system includes a chamber 102 having a lower chamber portion 102b and an upper chamber portion 102a. A center column 141 is configured to support a pedestal 140 formed of an electrically conductive material. The electrically conductive the pedestal 140 is connected to receive RF signals from an RF power supply 104 by way of a match network 106, depending on a setting of an RF direction control module 250. Also, in the substrate processing system 100 of FIG. 1A, a showerhead electrode 150 is configured and connected to receive RF signals from the RF power supply 104 by way of the match network 106, depending on the setting of the RF direction control module 250. In some embodiments, the RF direction control module 250 is configured to direct RF signals transmitted from the RF power supply 104 by way of the match network 106 to either the showerhead electrode 150 or to the pedestal 140. Also, the RF direction control module 250 is configured to electrically connect whichever one of the showerhead electrode 150 and the pedestal 140 that is not currently receiving RF signals to a reference ground potential. In this manner, at a given time, the RF direction control module 250 operates to ensure that either the showerhead electrode 150 will receive RF signals from the RF power supply 104 while the pedestal 140 is electrically connected to the reference ground potential, or the pedestal 140 will receive RF signals from the RF power supply 104 while the showerhead electrode 150 is electrically connected to the reference ground potential.

The RF power supply 104 is controlled by a control module 110, e.g., a controller. The control module 110 is configured to operate the substrate processing system 100 by executing process input and control instructions/programs 108. The process input and control instructions/programs 108 may include process recipes, having directions for parameters such as power levels, timing parameters, process gases, mechanical movement of the substrate 101, etc., such as to deposit or form films over the substrate 101.

In various embodiments, the RF power supply 104 can include one or more RF power sources operating at one or more frequencies. Multiple RF frequencies can be supplied at the same time to either the showerhead electrode 150 or the pedestal 140 based on operation of the RF direction control module 250. In some embodiments, frequencies of the RF power signals are set within a range extending from 1 kHz (kiloHertz) to 100 MHz (megaHertz). In some embodiments, frequencies of the RF power signals are set within a range extending from 400 kHz to 60 MHz. In some embodiments, the RF power supply 104 is set to generate RF signals at frequencies of 2 MHz, 27 MHz, and 60 MHz. In some embodiments, the RF power supply 104 is set to generate one or more high frequency RF signals within a frequency range extending from about 1 MHz to about 60 MHz, and generate one or more low frequency RF signals within a frequency range extending from about 100 kHz to about 1 MHz. The RF power supply 104 can include frequency-based filtering, i.e., high-pass filtering and/or low-pass filtering, to ensure that specified RF signal frequencies are transmitted. It should be understood that the above-mentioned RF frequency ranges are provided by way of example. In practice, the RF power supply 104 can be configured to generate essentially any RF signal having essentially any frequency as needed.

The match network 106 is configured to match impedances so that the RF signals generated by the RF power supply 104 can be transmitted effectively to a plasma load within the chamber 102. Generally speaking, the match network 106 is a network of capacitors and inductors that can be adjusted to tune impedance encountered by the RF signals in their transmission to the plasma load within the chamber 102.

In some embodiments, the center column 141 can include lift pins, which are controlled by lift pin control 122. The lift pins are used to raise the substrate 101 from the pedestal 140 to allow an end-effector to pick up the substrate 101, and to lower the substrate 101 after being placed by the end-effector. The substrate processing system 100 further includes a gas supply system 112 that is connected to process gas supplies 114, e.g., gas chemistry supplies from a facility. Depending on the processing being performed, the control module 110 controls the delivery of process gases 114 via the gas supply system 112. The chosen process gases are then flowed into the showerhead electrode 150 and distributed in a processing volume defined between the showerhead electrode 150 and the substrate 101 disposed upon the pedestal 140.

Further, the process gases may be premixed or not. Appropriate valving and mass flow control mechanisms may be employed within the gas supply system 112 to ensure that the correct process gases are delivered during the deposition and plasma treatment phases of the process. Process gases exit the processing volume and flow through an exhaust outlet 143. A vacuum pump (such as a one or two stage mechanical dry pump, among other types) draws process gases out of the processing volume and maintains a suitably low pressure within the processing volume by a closed loop feedback controlled flow restriction device, such as a throttle valve or a pendulum valve.

Also shown is a carrier ring 200 that encircles an outer region of the pedestal 140. The carrier ring 200 is configured to support the substrate 101 during transport of the substrate 101 to or from the pedestal 140. The carrier ring 200 is configured to sit over a carrier ring support region that is a step down from a substrate support region in the center of the pedestal 140. The carrier ring 200 has an annular shaped disc structure and includes an outer edge side of its disc structure, e.g., outer radius, and a substrate edge side of its disc structure, e.g., inner radius, that is closest to where the substrate 101 sits. The substrate edge side of the carrier ring 200 includes a plurality of contact support structures which are configured to lift the substrate 101 when the carrier ring 200 is lifted by spider forks 180. The carrier ring 200 is therefore lifted along with the substrate 101 and can be rotated to another station, e.g., in a multi-station system. Carrier ring lift and/or rotate control signals 124 are generated by the control module 110 to control operation of the spider forks 180 to lift and/or rotate the carrier ring 200.

In some embodiments, the electrical insulating layer 507 is disposed on a top surface of the pedestal 140, and an electrically conductive layer 509 is disposed on the electrically insulating layer 507. The electrically conductive layer 509 is configured to support the substrate 101. Also, in these embodiments, the electrically conductive layer can be electrically connected to a positive terminal of a direct current (DC) power supply 521 by way of a low pass filter 525. The DC power supply 521 is also connected to be controlled by the control module 110. Therefore, in some embodiments, electrical current can be transmitted from the DC power supply 521 through the low pass filter 525 to the electrically conductive layer 509, in accordance with a prescribed recipe as provided by the process input and control instructions/programs 108 and as executed by the control module 110.

Figure 1B:
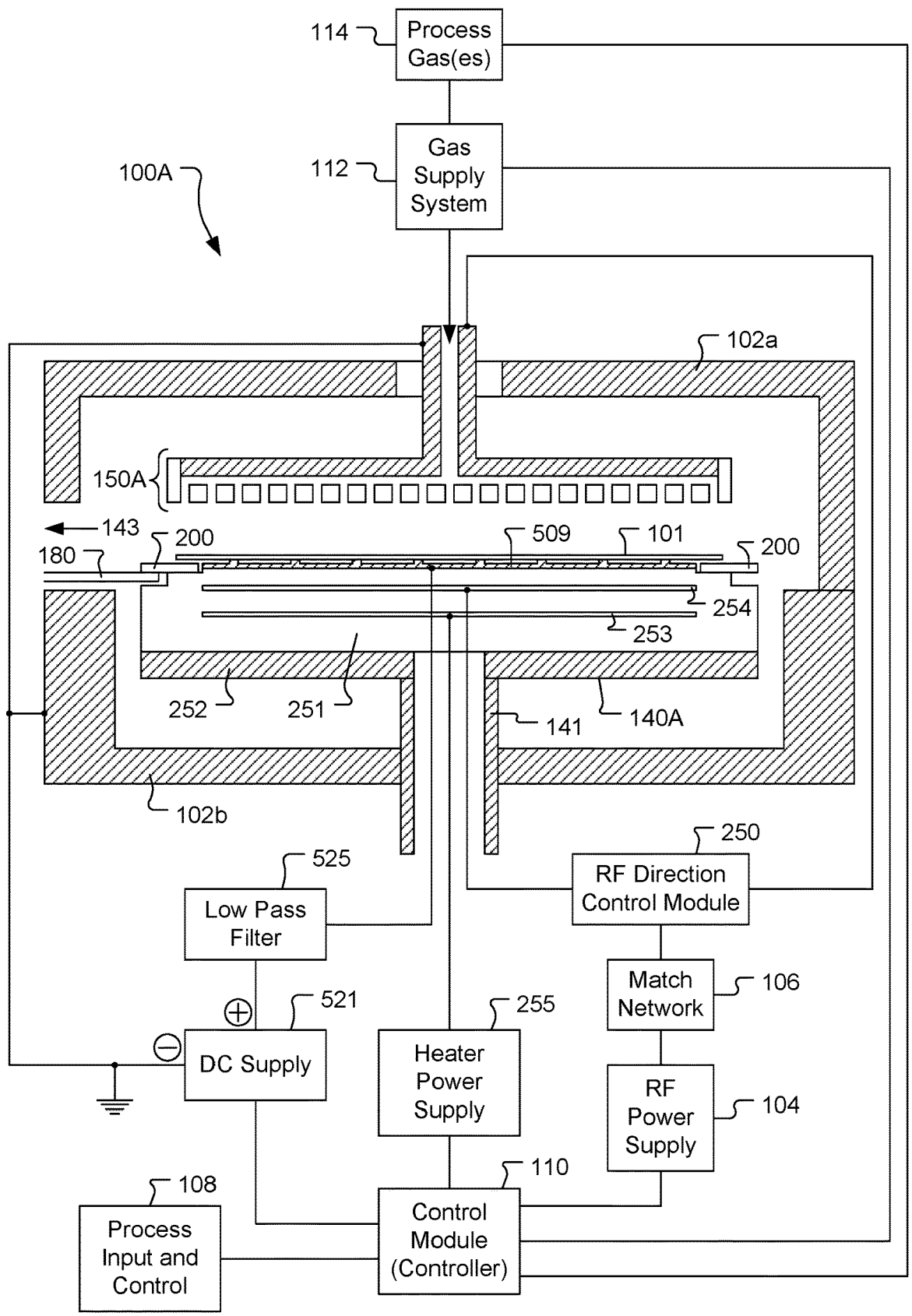
FIG. 1B illustrates a substrate processing system that is configured to perform an atomic layer deposition (ALD) process on the substrate, in accordance with some embodiments of the present invention.

FIG. 1B illustrates a substrate processing system 100A that is configured to perform an atomic layer deposition (ALD) process on the substrate 101 (e.g. an ALD oxide process), in accordance with some embodiments of the present invention. Similar componentry as described with regard to FIG. 1A is shown in FIG. 1B. Specifically, the substrate processing system 100A also includes the upper chamber portion 102a, the lower chamber portion 102b, the control module 110, the RF power supply 104, the match network 106, the electrically conductive layer 509, the DC power supply 521, the low pass filter 525, the carrier ring 200, and the spider forks 180. In the substrate processing system 100A, a pedestal 140A is configured to include a dielectric body 251. In some embodiments, the dielectric body 251 is affixed directly to the column 141. And, in some embodiments, the dielectric body 251 is supported by a conductive structure 252 that is affixed to the column 141. The electrically conductive layer 509 is disposed directly upon a top surface of the dielectric body 251 of the pedestal 140A.

In some embodiments, a heating component 253, such as a resistance heating element, is disposed with the dielectric body 251 of the pedestal 140A. The heating component 253 is connected to a heater power supply 255, which is in turn connected to the control module 110. With the heating component 253 present, in some embodiments, the heater power supply 255 can be operated in accordance with a prescribed recipe as provided by the process input and control instructions/programs 108 and as executed by the control module 110. It should also be understood that temperature measurement devices can be installed on/within the pedestal 140A and/or at other locations around the pedestal 140A to provide temperature measurement data to the control module 110, thereby enabling operation of a closed-loop temperature feedback control circuit between the control module 110 and the heater power supply 255.

The dielectric body 251 of the pedestal 140A includes an RF electrode 254 configured and connected to receive RF signals from the RF power supply 104 by way of the match network 106, depending on the setting of an RF direction control module 250. Also, in the substrate processing system 100A of FIG. 1B, a showerhead electrode 150A is configured and connected to receive RF signals from the RF power supply 104 by way of the match network 106, depending on the setting of the RF direction control module 250. In some embodiments, the RF direction control module 250 is configured to direct RF signals transmitted from the RF power supply 104 by way of the match network 106 to either the showerhead electrode 150A or to the RF electrode 254. Also, the RF direction control module 250 is configured to electrically connect whichever one of the showerhead electrode 150A and the RF electrode 254 that is not currently receiving RF signals to a reference ground potential. In this manner, at a given time, the RF direction control module 250 operates to ensure that either the showerhead electrode 150A will receive RF signals from the RF power supply 104 while the RF electrode 154 is electrically connected to the reference ground potential, or the RF electrode 154 will receive RF signals from the RF power supply 104 while the showerhead electrode 150A is electrically connected to the reference ground potential.

Figure 2:
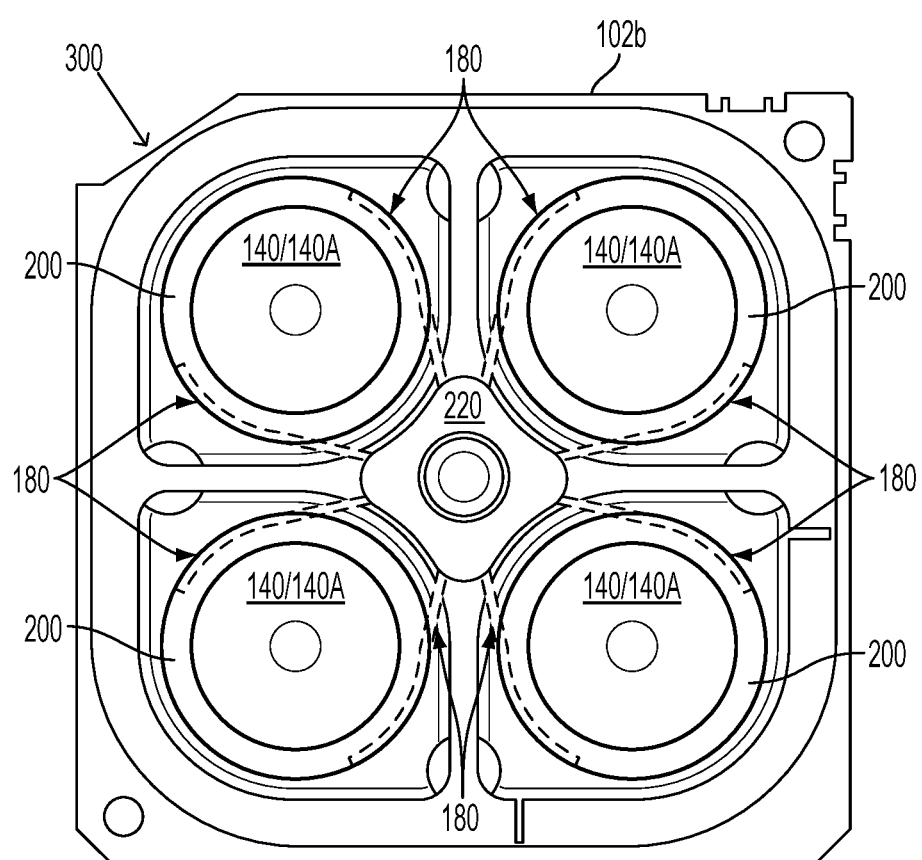
FIG. 2 shows a top view of a multi-station processing tool that includes four processing stations, in accordance with some embodiments of the present invention.

FIG. 2 shows a top view of a multi-station processing tool 300 that includes four processing stations, in accordance with some embodiments of the present invention. This top view is of the lower chamber portion 102b (e.g., with the top chamber portion 102a removed for illustration). The four processing stations are accessed by spider forks 180. Each spider fork 180, or fork, includes a first and second arm, each of which is positioned around a portion of each side of the pedestal 140/140A. The spider forks 180, using an engagement and rotation mechanism 220 are configured to raise up and lift the carrier rings 200 (i.e., from a lower surface of the carrier rings 200) from the processing stations in a simultaneous manner, and then rotate a distance of at least one or more stations before lowering the carrier rings 200 (where at least one of the carrier rings supports a substrate 101) so that further plasma processing, treatment and/or film deposition can take place on respective substrates 101.

Figure 3:
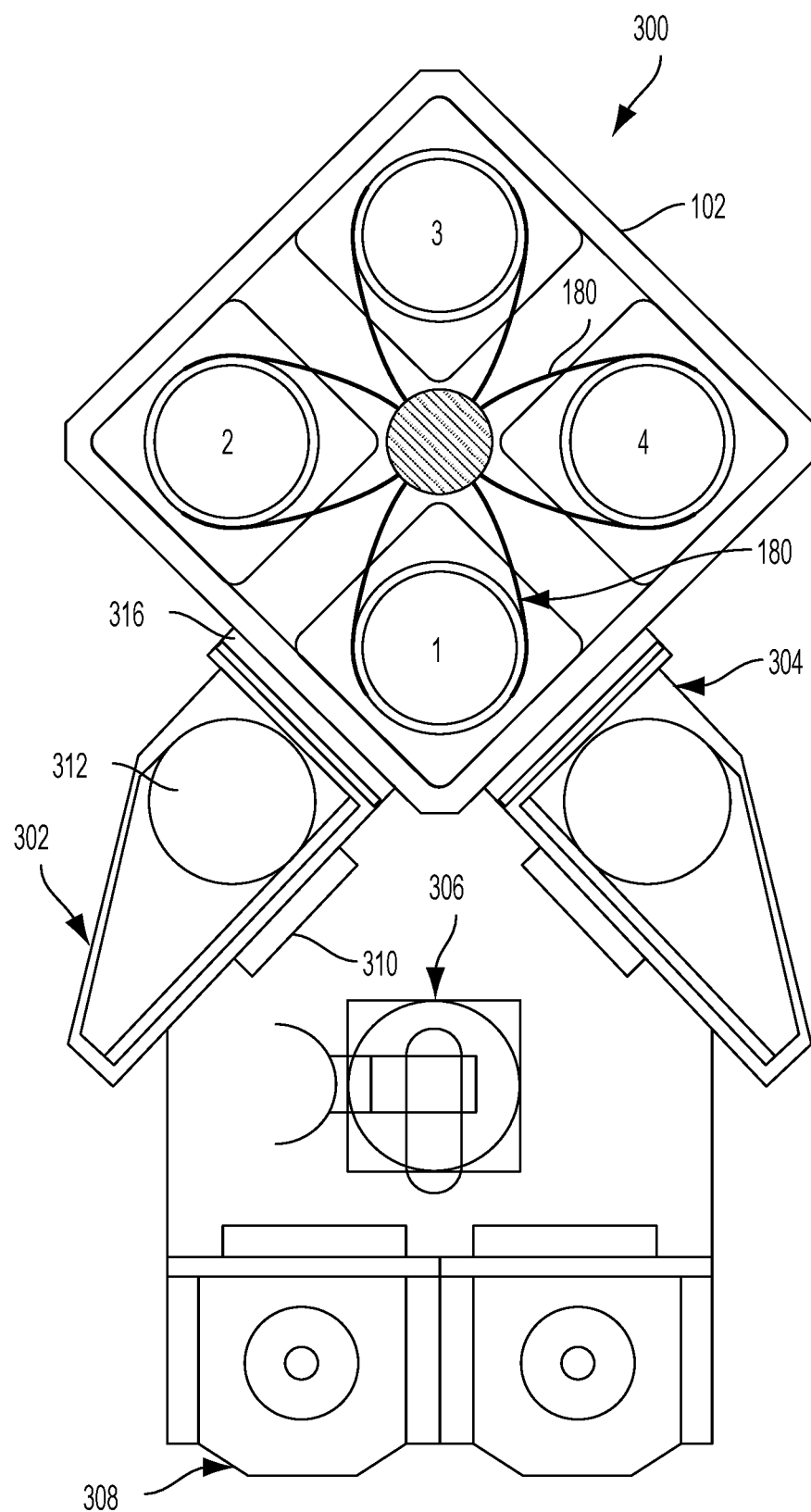
FIG. 3 shows a schematic view of an embodiment of the multi-station processing tool interfaced with an inbound load lock and an outbound load lock, in accordance with some embodiments of the present invention.

FIG. 3 shows a schematic view of an embodiment of the multi-station processing tool 300 interfaced with an inbound load lock 302 and an outbound load lock 304, in accordance with some embodiments of the present invention. A robot 306, at atmospheric pressure, is configured to move substrates 101 from a cassette loaded through a pod 308 into inbound load lock 302 via an atmospheric port 310. Inbound load lock 302 is coupled to a vacuum source/pump so that, when atmospheric port 310 is closed, inbound load lock 302 may be pumped down. Inbound load lock 302 also includes a chamber transport port 316 interfaced with processing chamber 102. Thus, when chamber transport 316 is opened, another robot 312 may move the substrate from inbound load lock 302 to the pedestal 140/140A of a first process station for processing.

The depicted processing chamber 102 comprises four process stations, numbered from 1 to 4 in the example embodiment shown in FIG. 3. In some embodiments, processing chamber 102 may be configured to maintain a low pressure environment so that substrates may be transferred using the carrier ring 200 among the process stations 1-4 without experiencing a vacuum break and/or air exposure. Each process station 1-4 depicted in FIG. 3 includes a pedestal 140/140A and showerhead electrode 150/150A and associated process gas supply connections. Also, it should be understood that in other embodiments the processing chamber 102 can include less than four process stations or more than four process stations.

FIG. 3 also shows the spider forks 180 for transferring substrates within the processing chamber 102. As mentioned above, the spider forks 180 rotate and enable transfer of substrates from one processing station to another. The transfer occurs by enabling the spider forks 180 to lift the carrier rings 200 from an outer undersurface, which lifts the substrates 101, and rotates the substrates 101 and carrier rings 200 together to the next processing station. In one configuration, the spider forks 180 are made from a ceramic material to withstand high levels of heat during processing.

Figure 4:
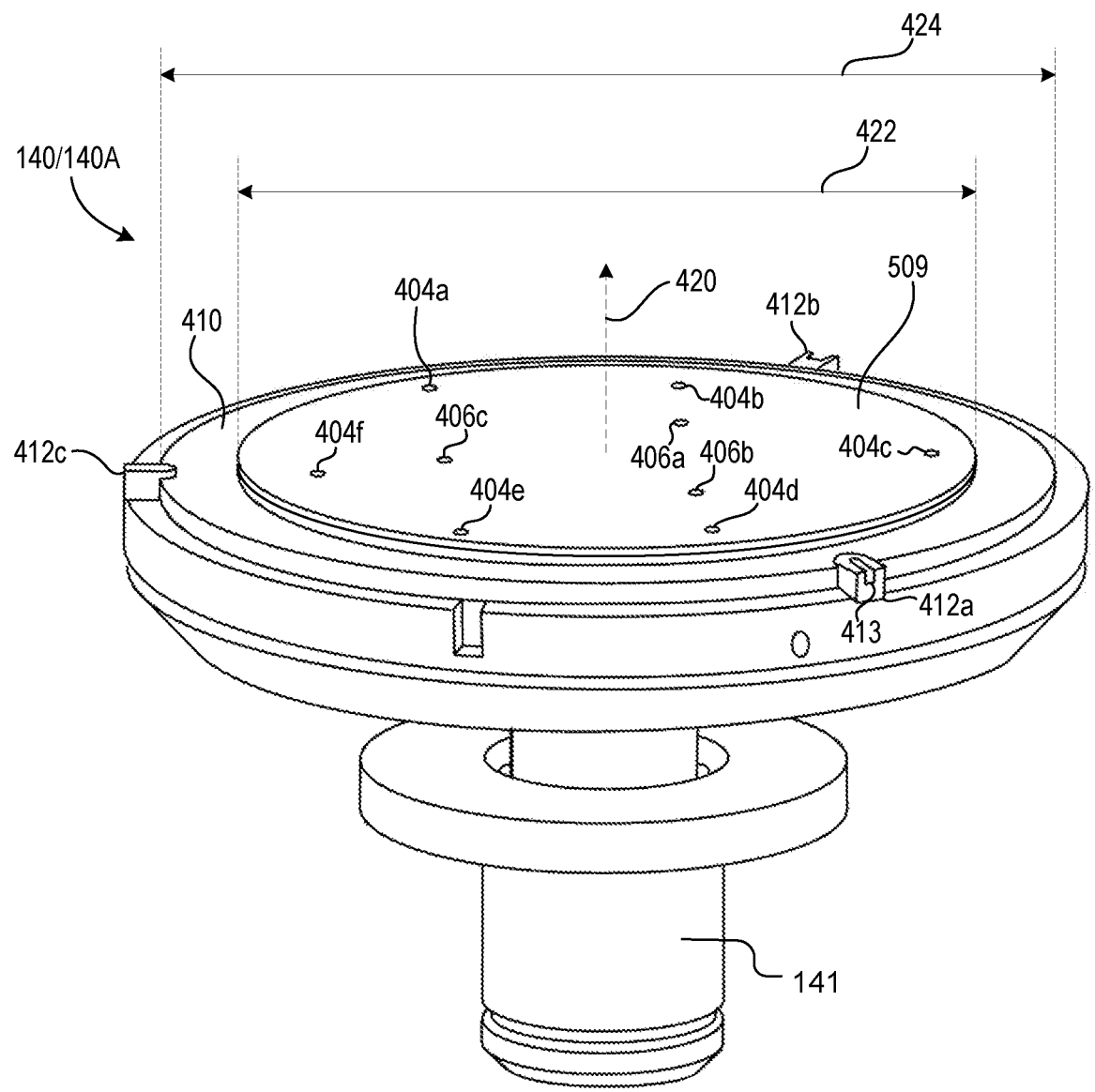
FIG. 4 shows an example of the pedestal configured to receive the substrate for a deposition process, in accordance with some embodiments of the present invention.

FIG. 4 shows an example of the pedestal 140/140A configured to receive the substrate 101 for a deposition process, such as an atomic layer deposition (ALD) process, in accordance with some embodiments of the present invention. The pedestal 140/140A includes the electrically conductive layer 509 positioned on a central top surface of the pedestal 140/140A, where the central top surface is defined by a circular area extending from a central axis 420 of the pedestal 140/140A to a top surface diameter 422 that defines the edge of the central top surface. The electrically conductive layer 509 includes a plurality of substrate supports 404a, 404b, 404c, 404d, 404e, and 404f, which are distributed across the electrically conductive layer 509 are which are configured to support the substrate 101. A substrate support level is defined by the vertical position of the bottom surface of the substrate 101 when seated on the substrate supports 404a, 404b, 404c, 404d, 404e, and 404f. In the example of FIG. 4, there are six substrate supports 404a, 404b, 404c, 404d, 404e, and 404f symmetrically distributed about a periphery of the electrically conductive layer 509. However, in other embodiments there may be any number of substrate supports on the electrically conductive layer 509, and the substrate supports can be distributed across the electrically conductive layer 509 in any suitable arrangement for supporting the substrate 101 during deposition process operations. FIG. 4 also shows recesses 406a, 406b, and 406c, which are configured to house lift pins. The lift pins can be utilized to raise the substrate 101 from the substrate supports 404a, 404b, 404c, 404d, 404e, and 404f to allow for engagement of the substrate 101 by an end-effector.

In some embodiments, each substrate support 404a, 404b, 404c, 404d, 404e, and 404f defines a minimum contact area structure (MCA). MCA's are used to improve precision mating between surfaces when high precision or tolerances are required, and/or minimal physical contact is desirable to reduce defect risk. Other surfaces in the system can also include MCA's, such as over the carrier ring 200 supports, and over the inner substrate support region of the carrier ring 200.

The pedestal 140/140A further includes an annular surface 410 extending from the top surface diameter 422 of the pedestal 140/140A to an outer diameter 424 of the annular surface 410. The annular surface 410 defines an annular region surrounding the electrically conductive layer 509, but at a step down from the electrically conductive layer 509. That is, the vertical position of the annular surface 410 is lower than the vertical position of the electrically conductive layer 509. A plurality of carrier ring supports 412a, 412b, and 412c are positioned substantially at/along the edge (outer diameter) of the annular surface 410 and are symmetrically distributed about the annular surface 410. The carrier ring supports can in some embodiments define MCA's for supporting the carrier ring 200. In some implementations, the carrier ring supports 412a, 412b, and 412c extend beyond the outer diameter 424 of the annular surface 410, whereas in other implementations they do not. In some implementations, the top surfaces of the carrier ring supports 412a, 412b, and 412c have a height that is slightly higher than that of the annular surface 410, so that when the carrier ring 200 is resting on the carrier ring supports 412a, 412b, and 4102c, the carrier ring 200 is supported at a predefined distance above the annular surface 410. Each carrier ring support 412a, 412b, and 412c may include a recess, such as recess 413 of carrier ring support 412a, in which an extension protruding from the underside of the carrier ring 200 is seated when the carrier ring 200 is supported by the carrier ring supports 412a, 412b, and 412c. The mating of the carrier ring extensions to the recesses (413) in the carrier ring supports 412a, 412b, and 412c provides for secure positioning of the carrier ring 200 and prevents the carrier ring 200 from moving when seated on the carrier ring supports 412a, 412b, and 412c.

In some implementations, the top surfaces of the carrier ring supports 412a, 412b, and 412c are flush with the annular surface 410. In other implementations, there are no carrier ring supports separately defined from the annular surface 410, so that the carrier ring 200 may rest directly on the annular surface 410, and such that no gap exists between the carrier ring 200 and the annular surface 410. In such implementations, a pathway between the carrier ring 200 and the annular surface 410 is closed, preventing precursor materials from reaching a backside/underside of the substrate 101 via this pathway.

In the example embodiment of FIG. 4, there are three carrier ring supports 412a, 412b, and 412c positioned symmetrically along the outer edge region of the annular surface 410. However, in other implementations, there may be more than three carrier ring supports, distributed at any locations along the annular surface 410 of the pedestal 140/140A, to support the carrier ring 200 in a stable resting configuration.

When the substrate 101 is supported by the substrate supports 404a, 404b, 404c, 404d, 404e, and 404f, and when the carrier ring 200 is supported by the carrier ring supports 412a, 412b, and 412c, an edge region of the substrate 101 is disposed over an inner portion of the carrier ring 200. Generally speaking, the edge region of the substrate 101 extends from an outer edge of the substrate 101 inward by about 2 millimeters (mm) to about 5 mm. A vertical separation is thereby defined between the edge region of the substrate 101 and the inner portion of the carrier ring 200. In some embodiments, this vertical separation is about 0.001 inch to about 0.010 inch. The support of the carrier ring 200 at the predefined distance above the annular surface 410 and the vertical separation between the edge region of the substrate 101 and the inner portion of the carrier ring 200, can be controlled to limit deposition on a backside/underside of the substrate 101 in the edge region of the substrate 101.

Some plasmas used to deposit thin films or to treat the substrate surface are unstable under conditions that are preferred from a process standpoint. For example, plasmas generated using an argon-rich process gas composition may be unstable under certain process conditions. However, use of the argon-rich plasma is preferred from a process standpoint. The argon-rich plasma enables deposition of very high quality films by way of ion bombardment, even at low temperatures (at 50° C. for patterning, by way of example). Also, unlike nitrogen-containing plasmas (such as $N_2$ or $N_2O$), argon-rich plasmas do not adversely affect the subsequent dry etch rates. As an example, $Ar/O_2$ capacitively-coupled-plasma (CCP) discharge operated within a 1 to 6 Torr pressure range and at high RF power (>200 W per 300 mm diameter substrate processing station) shows instabilities within the plasma. One such plasma instability, referred to herein as a "plasmoid," is characterized by small areas of higher density (brighter) plasma surrounded by larger volumes of normal density plasma. When plasmoids are formed, the deposited film is locally densified near the plasmoid due to interaction of the film with the local high density plasma corresponding to the plasmoid, which results in degraded film uniformity. A spatial distribution of plasmoids over the substrate 101 can vary from process-to-process, and within a given process. Also, the plasmoids can move across the substrate 101 during a given process. It should be understood that the plasmoids cause a degradation in process uniformity across the substrate 101, such as by changing a thickness of a deposited film at different locations across the substrate 101. The non-uniformity in film thickness caused by the plasmoids can be up to about 5% of the total film thickness, which can be significant in some applications that require an ultra-flat film profile. For example, films deposited using ALD can require angstrom-level thickness control. For example, for a deposited film thickness of 300 angstroms, the film thickness should be controlled to have a thickness variation of less than 2 angstroms over the entire substrate.

During an example film deposition process, an operation is performed to apply a monolayer of a precursor gas, without applying any RF power. The precursor gas sticks to the substrate 101. In some embodiments, the precursor gas includes silicon to enable formation of silicon oxide on the substrate. An operation is then performed to flush the precursor gas from the processing volume over the substrate 101, thereby leaving the monolayer of the precursor gas on the substrate 101. An oxidation process is then performed on the substrate 101. In the oxidation process, a process gas is flowed into the processing volume over the substrate 101 and RF power is applied to the process gas to generate a plasma within the processing volume. The plasma drives oxidation reactions on the substrate 101. In some embodiments, the process gas will contain oxygen plus one or more other bombardment gases, such as argon, among others, where the bombardment gas(es) provide sufficient densification of the plasma. The bombardment gas is a gas that is effective in densifying a deposited film. Bombardment gases that densify the deposited film are those gases that can effectively transfer energy to the deposited film. In some embodiments, the bombardment gases are monoatomic noble gases, such as argon, among others, that do not react chemically with the deposited film and that lack vibrational or rotational molecular modes. For instance, in an example process, the process gas mixture can include about 5% to about 20% oxygen with the balance of the process gas mixture being argon. And, in other example processes, the percentage of oxygen to the bombardment gas in the process gas mixture can be less than 5% or greater than 20%.

During the oxidation process, when a particular thickness of film is formed on the substrate 101, the plasmoids may begin to appear across the substrate 101. The number and size of the plasmoids has a direct correlation with the amount of the bombardment process gas, e.g., argon, in the process gas mixture. So, reducing of the amount of bombardment process gas in the process gas mixture may serve to reduce the intensity of the plasmoids. However, the higher percentage of bombardment process gas is also typically necessary to provide sufficient plasma density to ensure proper film formation and to improve film quality, e.g., better etch resistance, through bombardment by bombardment process gas ions, e.g., argon ions. Also, a large amount of RF power is needed to generate the plasma, because if there is not enough RF power applied, the plasma density will not be sufficient. However, increasing the applied RF power leads to formation of more plasmoids. Some process applications use about 300 W of applied RF power per 300 mm diameter substrate processing station. However, other process applications may require higher RF power, such as 400 W, or even higher, per 300 mm diameter substrate processing station.

In view of the foregoing, one approach for suppressing plasmoid formation is to reduce the applied RF power and/or increase the oxygen concentration within the gas mixture. More specifically, lower process power, i.e., lower applied RF power, or lower bombardment gas (typically argon) concentration within the process gas (with respect to oxygen) results in a lower plasma density, thus suppressing formation of plasmoids. Unfortunately, these conditions are not preferred from a deposited film quality perspective. For example, film quality is degraded when ion bombardment from the plasma is not sufficient at lower process power or lower bombardment gas concentration within the process gas. Therefore, it may not always be possible to maintain deposited film quality while suppressing plasmoid formation through lowering of the process power and/or lowering of the bombardment gas concentration, e.g., argon concentration, within the process gas.

Plasma-activated ALD silicon oxide ($SiO_2$) is used across multiple memory and logic applications in the semiconductor device industry, such as multiple patterning, hardmasks, electrical liners, through-silicon vias (TSVs), among others. Some plasma activated ALD $SiO_2$ processes use an argon-rich $O_2$/Ar plasma to convert the Si precursor on the substrate into the desired $SiO_2$ film. The argon-rich plasma provides for deposition of very high-quality films even at low temperatures (for example, at 50° C. in a patterning application) by providing ample ion bombardment. Also, use of argon-rich plasma is not detrimental to the subsequent dry etch rate of the deposited film, whereas use of nitrogen-containing plasma (such as $N_2$ or $N_2O$) does adversely affect the subsequent dry etch rate of the deposited film.

High-density argon-rich plasmas are susceptible to instabilities, such as plasmoids. The plasmoids are local plasma instabilities that are visually observable and that manifest as film thickness inconsistencies, often characterized as local decreases in film thickness across the substrate. As the film is deposited and grows in thickness, the plasmoids initially appear at a critical "threshold film thickness" and persist until the film reaches a "secured film thickness." For example, in the case of ALD of $SiO_2$ film, plasmoids can begin to appear at a threshold film thickness of about 75 angstroms (occurring at about 50 ALD cycles) and persist to a secured film thickness of about 180 angstroms (occurring at about 120 ALD cycles). Therefore, a significant amount of ALD processing occurs in the presence of the potentially damaging plasmoids. It should be understood that the particular values of the threshold film thickness and the secured film thickness between which plasmoids occur can vary based on process parameters and based on the precursor material used for depositing the film.

Instability in film thickness due to plasma instability causes local die/device failures which lead to semiconductor device production scraps. The film deposition process window in which plasma instability, such as plasmoids, can be avoided is considerably reduced, especially with respect to parameters of applied power and plasma exposure time. For example, plasmoid signatures begin to appear at a power level of about 300 Watts per processing station. High-power is clearly correlated to plasmoid formation because of the corresponding higher plasma density. Placing limitations on power in order to avoid plasmoid formation considerably narrows the available process window for film deposition and reduces the extendability of current film deposition processes to future technology nodes in which higher power will be needed to achieve acceptable film quality. Also, simply changing the plasma process gas from the argon-rich composition to an $O_2/N_2$ or $O_2/N_2O$ composition is not a viable option for mitigating plasmoid formation due to the improved ion bombardment of the substrate provided by the argon-rich plasma and due to the detrimental effects on subsequent dry etch rate of the film when N is present in the film. Therefore, it is of interest to prevent/suppress/mitigate plasma instabilities, such as plasmoids, during film deposition processes (such as ALD and/or PECVD) while maintaining use of the argon-rich plasma process gas.

The plasmoids are sustained by secondary electron emission from the growing film thickness, i.e., from the growing dielectric oxide surface. The secondary electron emission is increased by trapped charge defects and/or oxygen vacancies within the deposited film. The oxygen vacancies can manifest as a positively charged defects within the deposited film. Therefore, it is of interest to passivate/neutralize/correct the trapped charge defects and/or oxygen vacancies within the deposited film in order to reduce secondary electron emission from the film and in turn reduce plasmoid formation.

Systems and methods are disclosed herein to prevent/suppress/mitigate plasma instability, such as the plasmoid, during ALD and PECVD processes by treating and/or exposing the film deposited on the surface of the substrate to ultraviolet (UV) radiation. The UV radiation causes reactions that serve to passivate/neutralize/correct the trapped charge defects and/or oxygen vacancies within the deposited film in order to reduce secondary electron emission from the film and in turn reduce plasmoid formation. For example, UV radiation of tailored energies can generate energetic electrons from the bulk material underlying the deposited film, and these energetic electrons can migrate to the surface of the film and passivate oxygen vacancies that are hole-type defects. Also, the UV radiation can induce secondary film correction effects, such as elimination of silanols (Si—OH) to provide more robust Si—O—Si backbonding of the film. The UV-induced effects can reduce trapped charge density in the deposited film. The systems and methods disclosed herein for UV treatment of the deposited film are particularly useful in processes for ALD of $SiO_2$ film on the substrate.

UV is a spectral category of electromagnetic radiation having a wavelength ($\lambda$) within a range extending from 100 nanometers (nm) to 400 nm. The UV spectrum can be divided into several spectral sub-categories including vacuum ultraviolet (VUV) (10 nm$\leq\lambda<$200 nm), extreme ultraviolet (EUV) (10 nm$\leq\lambda<$121 nm), hydrogen Lyman-alpha (H Lyman-$\alpha$) (121 nm$\leq\lambda<$122 nm), far ultraviolet (FUV) (122 nm$\leq\lambda<$200 nm), ultraviolet C (UVC) (100 nm$\leq\lambda<$280 nm), middle ultraviolet (MUV) (200 nm$\leq\lambda<$300 nm), ultraviolet B (UVB) (280 nm$\leq\lambda<$315 nm), near ultraviolet (NUV) (300 nm$\leq\lambda<$400 nm), and ultraviolet A (UVA) (315 nm$\leq\lambda<$400 nm). For ease of description, the term "UV radiation" is used herein to refer to electromagnetic radiation characterized by any one or more of the spectral sub-categories of the UV spectrum.

In some embodiments, a film deposited through ALD and/or PECVD is exposed to UV radiation as part of a pre-treatment of the film and/or smart-treatment of the film during the ALD and/or PECVD process in order to passivate/correct surface defects in the film and/or reduce trapped charge density within the film, which in turn prevents/suppresses/mitigates formation of plasma instabilities, e.g., plasmoids, during continuation of the ALD and/or PECVD process to complete formation of the film. The smart-treatment of the film refers to exposure of the film to UV radiation in an in-situ manner and in an as-needed manner in order to passivate/correct surface defects in the film as the film is deposited to reach its overall final thickness. In some embodiments, exposure of the film to the UV radiation can be done in-situ by generating/supplying UV radiation within the ALD and/or PECVD processing environment, such as by generating a He plasma that emanates UV radiation or by operating a UV radiation source installed within the ALD and/or PECVD processing environment, by way of example. Also, in some embodiments, exposure of the film to the UV radiation can be done ex-situ by placing the substrate with the partially deposited film present thereon within a separate device configured to expose the substrate to the required amount of the UV radiation.

The systems and methods disclosed herein for using UV radiation to passivate/neutralize/correct film surface defects in order to prevent/suppress/mitigate plasma instability, such as the plasmoid, during ALD and/or PECVD processes serve to expand the effective ALD and/or PECVD process window with regard to process gas composition, process gas flow rates, pressure, and/or applied RF power. It should be understood that the term "surface" with regard to "surface defects" can be several molecular layers extending into the "bulk" of the substrate and/or materials present on the surface of the substrate. Also, the term "surface" can refer to a top thickness of material on the substrate as defined by the mean free path of the electron emission. It should be understood that the systems and methods disclosed herein can be used with deposition of essentially any type of dielectric film, including oxides (MxOy) and nitrides (MxNy), where plasma instability can occur due to film surface defects, oxygen vacancies, and/or trapped charge defects, and can be used with any type of deposition process, such as ALD and PECVD, among others. Additionally, it should be understood that the systems and methods disclosed herein can use many different techniques for generation of the required UV radiation, and can apply the required UV radiation in either an in-situ manner or ex-situ manner relative to the film deposition process.

In some embodiments, generation of the UV radiation for resolving, e.g., passivating/neutralizing/correcting, of the film surface defects is done in an in-situ manner by generating a He plasma in exposure to the substrate during ALD and/or PECVD processing of the substrate. For example, in some embodiments, the He plasma is generated in conjunction with generation of the $Ar/O_2$ plasma during deposition of the film on the substrate. The He plasma emits high energy UV radiation, which is incident upon the film surface on the substrate. When the UV radiation is incident upon the substrate, energy of the UV radiation is imparted in a photo-initiation process to induce a reaction on the substrate, which serves to resolve the film surface defects on the substrate.

Figure 5:
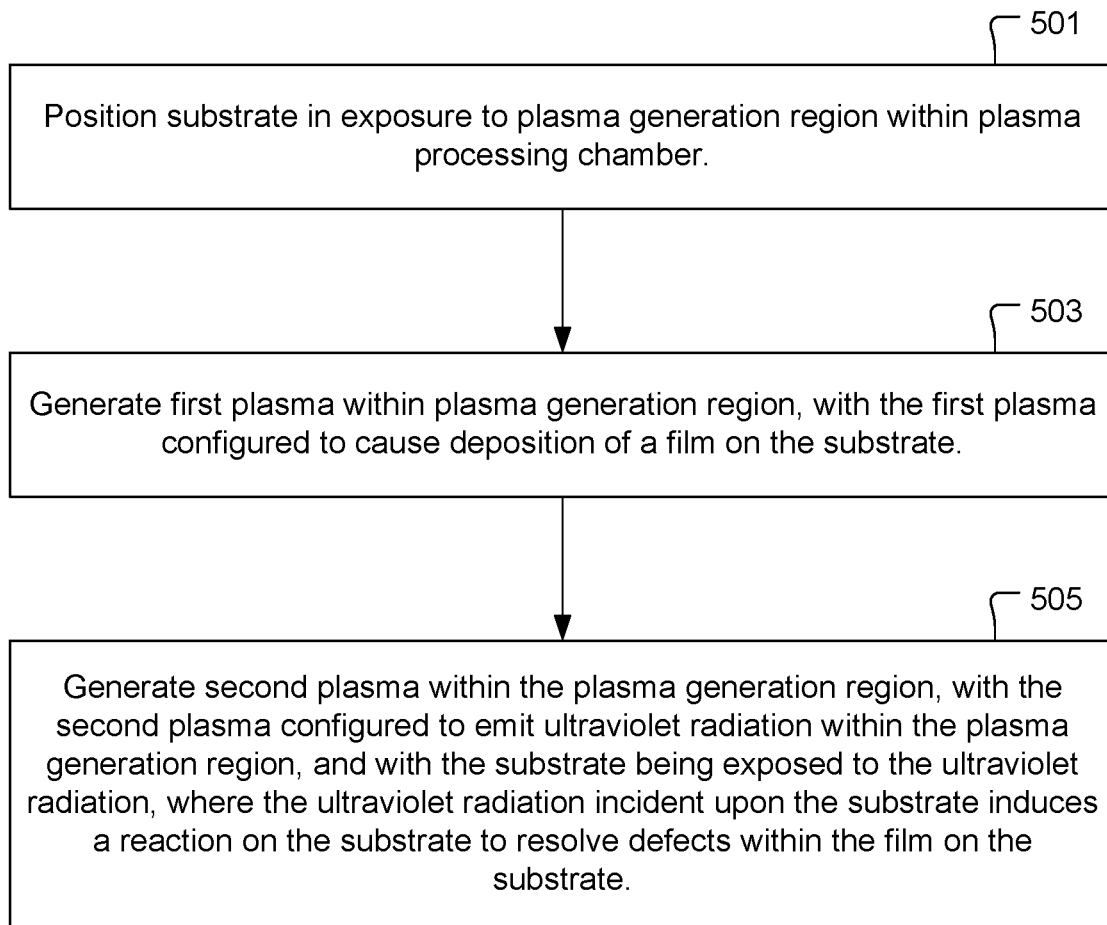
FIG. 5 shows a flowchart of a method for in-situ treatment of film surface defects during a plasma-based film deposition process, in accordance with some embodiments of the present invention.

FIG. 5 shows a flowchart of a method for in-situ treatment of film surface defects during a plasma-based film deposition process, in accordance with some embodiments of the present invention. The method of FIG. 5 can be performed using essentially any type of plasma processing system equipped to perform plasma-based film deposition processes, such as the substrate processing systems 100/100A described with regard to FIGS. 1A, 1B, 2, 3, and 4, by way of example. The method includes an operation 501 for positioning a substrate in exposure to a plasma generation region within a plasma processing chamber. The method also includes an operation 503 for generating a first plasma within the plasma generation region. The first plasma is configured to cause deposition of a film on the substrate. In some embodiments, the first plasma is generated using a process gas composition of argon and oxygen. However, it should be understood that in other embodiments the first plasma can be generated using a process gas or process gas mixture other than argon and oxygen, so long as the first plasma is configured to cause deposition of the desired film on the substrate in an acceptable manner. In some embodiments, the film deposited on the substrate is a silicon dioxide film. However, it should be understood that in other embodiments the method of FIG. 5 can be performed using a first plasma configured to deposit a film of essentially any type of material.

The method also includes an operation 505 for generating a second plasma within the plasma generation region. The second plasma is configured to emit UV radiation within the plasma generation region, with the substrate being exposed to the UV radiation. The UV radiation incident upon the substrate induces a reaction on the substrate to resolve defects within the film on the substrate. In some embodiments, the first plasma and the second plasma are generated simultaneously within the plasma generation region. In some embodiments, the defects within the film deposited on the substrate can include oxygen vacancies and/or trapped charges and/or other anomalies within the film that can lead to plasma instabilities during further plasma-based deposition of the film on the substrate. In some embodiments, the reaction on the substrate induced by the UV radiation resolves defects within the film on the substrate through one or more processes of passivation and charge neutralization.

In some embodiments, the second plasma is generated using a process gas composition of helium. However, it should be understood that in other embodiments the second plasma can be generated using a process gas or process gas mixture other than helium, so long as the second plasma generates sufficient UV radiation to resolve defects within the deposited film, and so long as the second plasma does not adversely affect the deposited film and does not adversely affect subsequent processing of the deposited film.

In some embodiments, the second plasma is generated within the plasma generation region after the film deposited on the substrate reaches a threshold film thickness. As previously mentioned, the threshold film thickness corresponds to a thickness of the deposited film at which plasma instabilities begin to occur due to defects within the deposited film, such as oxygen vacancies and/or trapped charges and/or other anomalies within the film that can facilitate ejection of secondary electrons when the substrate is subjected to bombardment by energetic ions from the plasma. The ejected secondary electrons can be accelerated to high energy when pulled into the bulk plasma through the plasma sheath. And, the accelerated electrons may form regions of high-density, unstable plasma, such as the plasmoids. Such a behavior is observed in argon-rich gas mixtures when discharge interacts with specific surfaces (e.g., film of specific composition and thickness). In some embodiments, the threshold film thickness is within a range extending up to about 75 angstroms.

In some embodiments, the UV emanating second plasma is continuously generated within the plasma generation region as the film deposited on the substrate grows in thickness from the threshold film thickness to a secured film thickness. The secured film thickness corresponds to a thickness of the deposited film at which plasma instabilities no longer occur due to defects within the deposited film. In some embodiments, the secured film thickness is within a range greater than or equal to about 180 angstroms.

In some embodiments, defects within the film deposited on the substrate are resolved by applying UV radiation to the film in a smart-treatment manner. For example, in some embodiments, defects within the film are treated in an in-situ manner by generating a helium plasma in exposure to the substrate such that UV radiation emanating from the helium plasma will be incident upon the film prior to the film reaching an unresolved thickness equal to the threshold film thickness, where the unresolved thickness of the film corresponds to the thickness of the film that has been deposited since the most recent resolution of defects within the film through exposure of the film to the UV radiation. Exposure of the deposited film to the UV radiation in the smart-treatment manner may be done several times during deposition of the film to reach its total prescribed thickness on the substrate.

Figure 6:
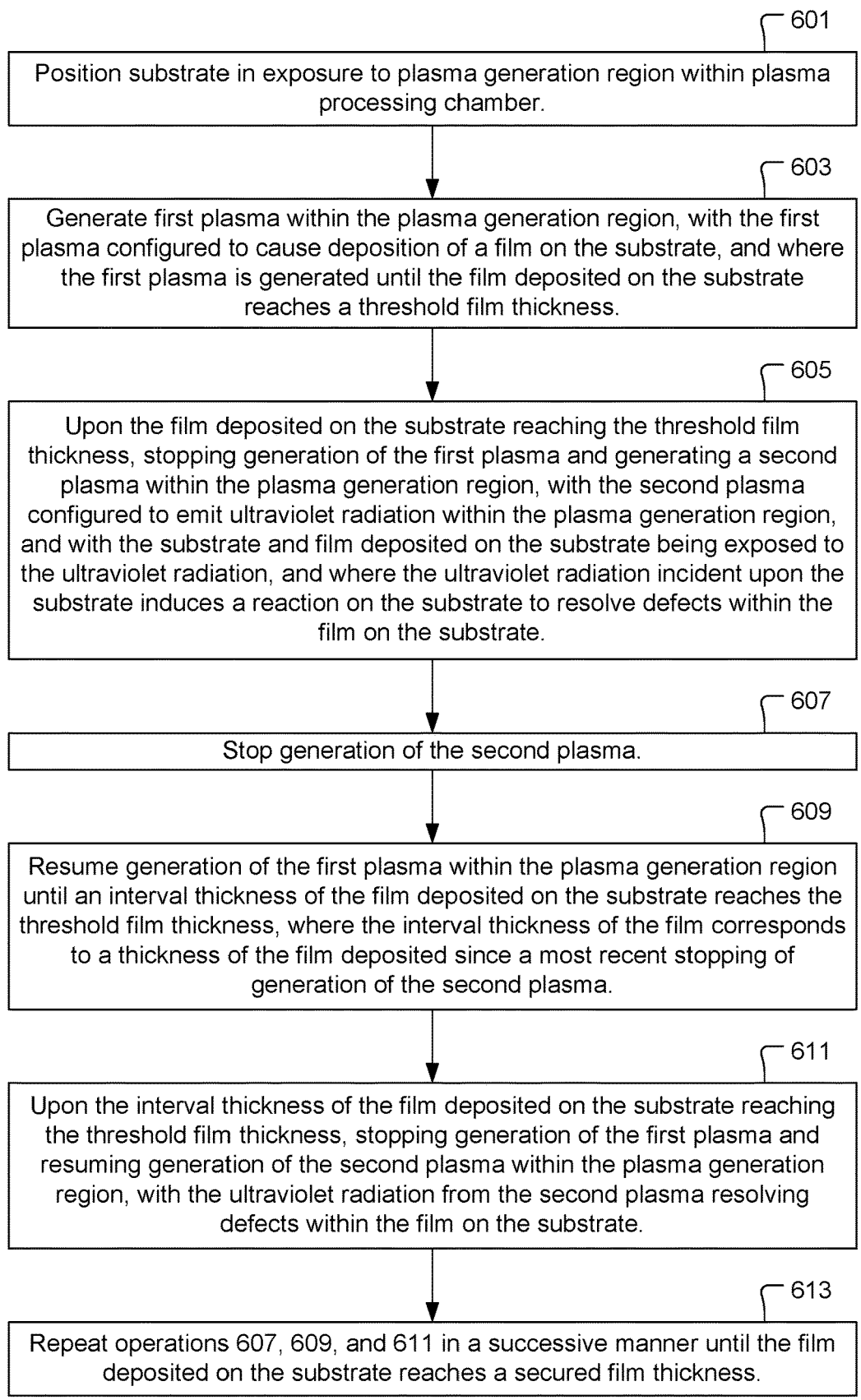
FIG. 6 shows a flowchart of a method for in-situ treatment of film surface defects during a plasma-based film deposition process, in accordance with some embodiments of the present invention.

FIG. 6 shows a flowchart of a method for in-situ treatment of film surface defects during a plasma-based film deposition process, in accordance with some embodiments of the present invention. The method of FIG. 6 can be performed using essentially any type of plasma processing system equipped to perform plasma-based film deposition processes, such as the substrate processing systems 100/100A described with regard to FIGS. 1A, 1B, 2, 3, and 4, by way of example. The method includes an operation 601 for positioning a substrate in exposure to a plasma generation region within a plasma processing chamber. The method also includes an operation 603 for generating a first plasma within the plasma generation region. The first plasma is configured to cause deposition of a film on the substrate. In some embodiments, the first plasma is generated using a process gas composition of argon and oxygen. However, it should be understood that in other embodiments the first plasma can be generated using a process gas or process gas mixture other than argon and oxygen, so long as the first plasma is configured to cause deposition of the desired film on the substrate in an acceptable manner. In some embodiments, the film deposited on the substrate is a silicon dioxide film. However, it should be understood that in other embodiments the method of FIG. 6 can be performed using a first plasma configured to deposit a film of essentially any type of material.

The first plasma is generated in the operation 603 until the film deposited on the substrate reaches a threshold film thickness. As previously mentioned, the threshold film thickness corresponds to a thickness of the deposited film at which plasma instabilities begin to occur due to defects within the deposited film, such as oxygen vacancies and/or trapped charges and/or other anomalies within the film. In some embodiments, the threshold film thickness is within a range extending up to about 75 angstroms.

Upon the film deposited on the substrate reaching the threshold film thickness, the method proceeds with an operation 605 for stopping generation of the first plasma and generating a second plasma within the plasma generation region. The second plasma is configured to emit UV radiation within the plasma generation region, with the substrate and film deposited on the substrate being exposed to the UV radiation, where the UV radiation incident upon the substrate induces a reaction on the substrate to resolve defects within the film on the substrate. In some embodiments, the second plasma is generated using a process gas composition of helium. However, it should be understood that in other embodiments the second plasma can be generated using a process gas or process gas mixture other than helium, so long as the second plasma generates sufficient UV radiation to resolve defects within the deposited film, and so long as the second plasma does not adversely affect the deposited film and does not adversely affect subsequent processing of the deposited film.

The method also includes an operation 607 for stopping generation of the second plasma. In some embodiments, stopping generation of the second plasma in operation 607 occurs when the second plasma has been continuously generated for a duration within a range extending from about 5 seconds to about 60 seconds. However, in other embodiments, generation of the second plasma can be stopped when the second plasma has been continuously generated for either less than 5 seconds or more than 60 seconds. The method also includes an operation 609 for resuming generation of the first plasma within the plasma generation region until an interval thickness of the film deposited on the substrate reaches the threshold film thickness. The interval thickness of the film corresponds to a thickness of the film deposited since a most recent stopping of generation of the second plasma. In other words, the interval thickness of the film corresponds to a thickness of the film that has been deposited since the most recent exposure of the film to the UV radiation to resolve defects within the film.

Upon the interval thickness of the film deposited on the substrate reaching the threshold film thickness, the method proceeds with an operation 611 for stopping generation of the first plasma and resuming generation of the second plasma within the plasma generation region. In the operation 611, the UV radiation from the second plasma again serves to resolve defects within the film on the substrate. The method also includes an operation 613 for repeating operations 607, 609, and 611 in a successive manner until the film deposited on the substrate reaches a secured film thickness. The secured film thickness corresponds to a thickness of the deposited film at which plasma instabilities no longer occur due to defects within the deposited film. In some embodiments, the secured film thickness is within a range greater than or equal to about 180 angstroms. The method can also include an operation for resuming generation of the first plasma within the plasma generation region after the film deposited on the substrate reaches the secured film thickness and until the film deposited on the substrate reaches a total prescribed film thickness.

In some embodiments, the film deposited on the substrate can be exposed to the UV radiation in an ex-situ manner for resolving of defects within the film. In such embodiments, the substrate is transferred from the plasma processing system within which the film is being deposited to a separate UV irradiation device within which the film is exposed to UV radiation. In some embodiments, the substrate can be transferred back-and-forth between the plasma processing system and the UV irradiation device multiple times as the total prescribed film thickness is deposited on the substrate.

Figure 7:
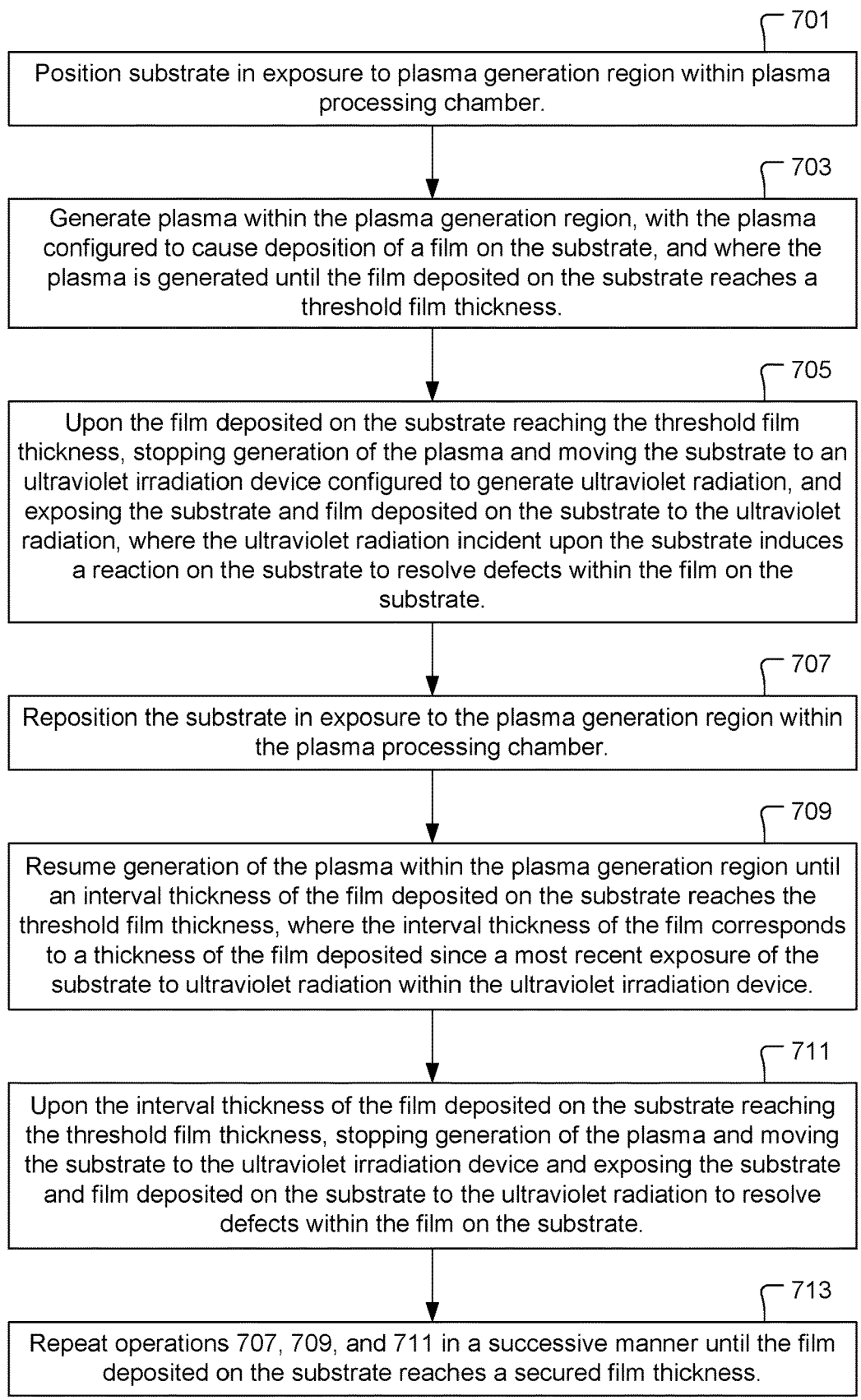
FIG. 7 shows a flowchart of a method for ex-situ treatment of film surface defects during a plasma-based film deposition process, in accordance with some embodiments of the present invention.

FIG. 7 shows a flowchart of a method for ex-situ treatment of film surface defects during a plasma-based film deposition process, in accordance with some embodiments of the present invention. The method includes an operation 701 for positioning a substrate in exposure to a plasma generation region within a plasma processing chamber. The method of FIG. 7 can be performed using essentially any type of plasma processing system equipped to perform plasma-based film deposition processes, such as the substrate processing systems 100/100A described with regard to FIGS. 1A, 1B, 2, 3, and 4, by way of example. The method also includes an operation 703 for generating a plasma within the plasma generation region. The plasma is configured to cause deposition of a film on the substrate.

In some embodiments, the plasma is generated using a process gas composition of argon and oxygen. However, it should be understood that in other embodiments the plasma can be generated using a process gas or process gas mixture other than argon and oxygen, so long as the plasma is configured to cause deposition of the desired film on the substrate in an acceptable manner. In some embodiments, the film deposited on the substrate is a silicon dioxide film. However, it should be understood that in other embodiments the method of FIG. 7 can be performed using a first plasma configured to deposit a film of essentially any type of material.

The plasma is generated in the operation 703 until the film deposited on the substrate reaches a threshold film thickness. As previously mentioned, the threshold film thickness corresponds to a thickness of the deposited film at which plasma instabilities begin to occur due to defects within the deposited film, such as oxygen vacancies and/or trapped charges and/or other anomalies within the film that can facilitate ejection of secondary electrons from the film material when the film is subjected to bombardment by energetic ions from the plasma. In some embodiments, the threshold film thickness is within a range extending up to about 75 angstroms.

Upon the film deposited on the substrate reaching the threshold film thickness, the method proceeds with an operation 705 for stopping generation of the plasma and moving the substrate to a UV irradiation device configured to generate UV radiation. In some embodiments, the UV irradiation device is configured separate from the plasma processing chamber in which the plasma-based film deposition process is performed. The operation 705 also includes exposing the substrate and film deposited on the substrate to the UV radiation, where the UV radiation incident upon the substrate induces a reaction on the substrate to resolve defects within the film on the substrate. In some embodiments, the defects within the film deposited on the substrate can include oxygen vacancies and/or trapped charges and/or other anomalies within the film that can lead to plasma instabilities during further plasma-based deposition of the film on the substrate. In some embodiments, the reaction on the substrate induced by the UV radiation resolves defects within the film on the substrate through one or more processes of passivation and charge neutralization.

The method continues with an operation 707 for repositioning the substrate in exposure to the plasma generation region within the plasma processing chamber. The method also includes an operation 709 for resuming generation of the plasma within the plasma generation region until an interval thickness of the film deposited on the substrate reaches the threshold film thickness, where the interval thickness of the film corresponds to a thickness of the film deposited since a most recent exposure of the substrate to UV radiation within the UV irradiation device. In other words, the interval thickness of the film corresponds to a thickness of the film that has been deposited since the most recent exposure of the film to the UV radiation to resolve defects within the film.

Upon the interval thickness of the film deposited on the substrate reaching the threshold film thickness, the method proceeds with an operation 711 for again stopping generation of the plasma and again moving the substrate to the UV irradiation device. The operation 711 also includes exposing the substrate and film deposited on the substrate to the UV radiation to again resolve defects within the film on the substrate. The method includes an operation 713 for repeating operations 707, 709, and 711 in a successive manner until the film deposited on the substrate reaches a secured film thickness. The secured film thickness corresponds to a thickness of the deposited film at which plasma instabilities no longer occur due to defects within the deposited film. In some embodiments, the secured film thickness is within a range greater than or equal to about 180 angstroms.

In some embodiments, the UV irradiation device used in operations 705 and 711 is configured to generate a second plasma in exposure to the substrate, where the second plasma is configured to emit a sufficient amount of UV radiation to resolve defects present within the film deposited on the substrate. In some of these embodiments, the second plasma is generated using a process gas composition of helium. However, it should be understood that in other embodiments the second plasma can be generated using a process gas or process gas mixture other than helium, so long as the second plasma generates sufficient UV radiation to resolve defects within the deposited film, and so long as the second plasma does not adversely affect the deposited film and does not adversely affect subsequent processing of the deposited film.

Also, in some embodiments, an electrically powered UV radiation source is disposed within the UV irradiation device used in operations 705 and 711. In these embodiments, the electrically powered UV radiation source is configured to emit a sufficient amount of UV radiation to resolve defects present within the film deposited on the substrate. For example, in some embodiments, the UV radiation source is an electrically powered lamp configured to emit photons in the UV spectrum. Also, in some embodiments, the UV irradiation device can include an arrangement of lenses and/or optical fibers for distribution and transmission of the UV radiation from the UV radiation source to the film deposited on the substrate.

Figure 8:
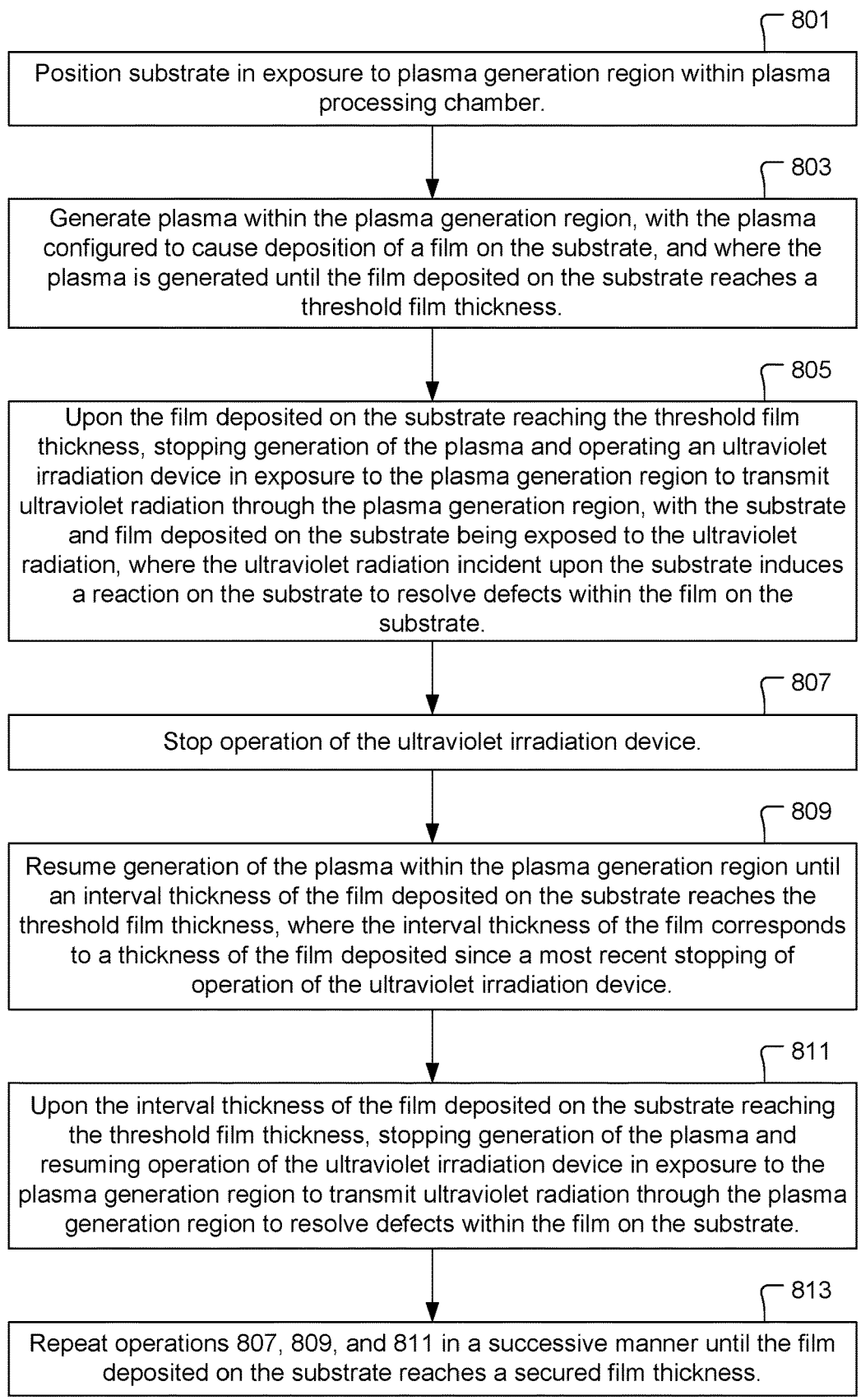
FIG. 8 shows a flowchart of a method for in-situ treatment of film surface defects during a plasma-based film deposition process using an ultraviolet irradiation device disposed in exposure to the plasma generation region within the plasma processing chamber, in accordance with some embodiments of the present invention.

In some embodiments, defects within the film deposited on the substrate can be resolved by exposing the film to UV radiation in an in-situ manner using a UV irradiation device disposed in exposure to the plasma generation region within the plasma processing chamber. FIG. 8 shows a flowchart of a method for in-situ treatment of film surface defects during a plasma-based film deposition process using a UV irradiation device disposed in exposure to the plasma generation region within the plasma processing chamber, in accordance with some embodiments of the present invention. The method includes an operation 801 for positioning a substrate in exposure to a plasma generation region within a plasma processing chamber. The method includes an operation 803 for generating a plasma within the plasma generation region, with the plasma configured to cause deposition of a film on the substrate. The plasma is generated in operation 803 until the film deposited on the substrate reaches a threshold film thickness. In some embodiments, the plasma is generated using a process gas composition of argon and oxygen. However, it should be understood that in other embodiments the plasma can be generated using a process gas or process gas mixture other than argon and oxygen, so long as the plasma is configured to cause deposition of the desired film on the substrate in an acceptable manner. Also, in some embodiments, the film deposited on the substrate is a silicon dioxide film. However, it should be understood that in other embodiments the method of FIG. 8 can be performed using a plasma configured to deposit a film of essentially any type of material.

As previously mentioned, the threshold film thickness corresponds to a thickness of the deposited film at which plasma instabilities begin to occur due to defects within the deposited film, such as oxygen vacancies and/or trapped charges and/or other anomalies within the film that can facilitate ejection of secondary electrons from the film material when the film is subjected to bombardment by energetic ions from the plasma. In some embodiments, the threshold film thickness is within a range extending up to about 75 angstroms.

Upon the film deposited on the substrate reaching the threshold film thickness, the method proceeds with an operation 805 for stopping generation of the plasma and operating the UV irradiation device in exposure to the plasma generation region to transmit UV radiation through the plasma generation region, with the substrate and film deposited on the substrate being exposed to the UV radiation, where the UV radiation incident upon the substrate induces a reaction on the substrate to resolve defects within the film on the substrate. In some embodiments, the defects within the film deposited on the substrate can include oxygen vacancies and/or trapped charges and/or other anomalies within the film that can lead to plasma instabilities during further plasma-based deposition of the film on the substrate. In some embodiments, the reaction on the substrate induced by the UV radiation resolves defects within the film on the substrate through one or more processes of passivation and charge neutralization.

In some embodiments, the UV irradiation device includes an electrically powered UV radiation source. In these embodiments, the electrically powered UV radiation source is configured to emit a sufficient amount of UV radiation to resolve defects present within the film deposited on the substrate. For example, in some embodiments, the UV radiation source is an electrically powered lamp configured to emit photons in the UV spectrum. Also, in some embodiments, the UV irradiation device can include an arrangement of lenses and/or optical fibers for distribution and transmission of the UV radiation from the UV radiation source to the film deposited on the substrate. Also, it should be understood that in different embodiments the UV irradiation device and its operation can have variations in photon energy and/or lamp configuration and/or ambient conditions.

The method also includes an operation 807 for stopping operation of the UV irradiation device after the defects within the film have been sufficiently resolved. The method continues with an operation 809 for resuming generation of the plasma within the plasma generation region until an interval thickness of the film deposited on the substrate reaches the threshold film thickness, where the interval thickness of the film corresponds to a thickness of the film deposited since a most recent stopping of operation of the UV irradiation device. In other words, the interval thickness of the film corresponds to a thickness of the film that has been deposited since the most recent exposure of the film to the UV radiation to resolve defects within the film.

Upon the interval thickness of the film deposited on the substrate reaching the threshold film thickness, the method proceeds with an operation 811 for stopping generation of the plasma and resuming operation of the UV irradiation device in exposure to the plasma generation region to transmit UV radiation through the plasma generation region to resolve defects within the film on the substrate. The method also includes an operation 813 for repeating operations 807, 809, and 811 in a successive manner until the film deposited on the substrate reaches a secured film thickness. The secured film thickness corresponds to a thickness of the deposited film at which plasma instabilities no longer occur due to defects within the deposited film. In some embodiments, the secured film thickness is within a range greater than or equal to about 180 angstroms.

Figure 9A:
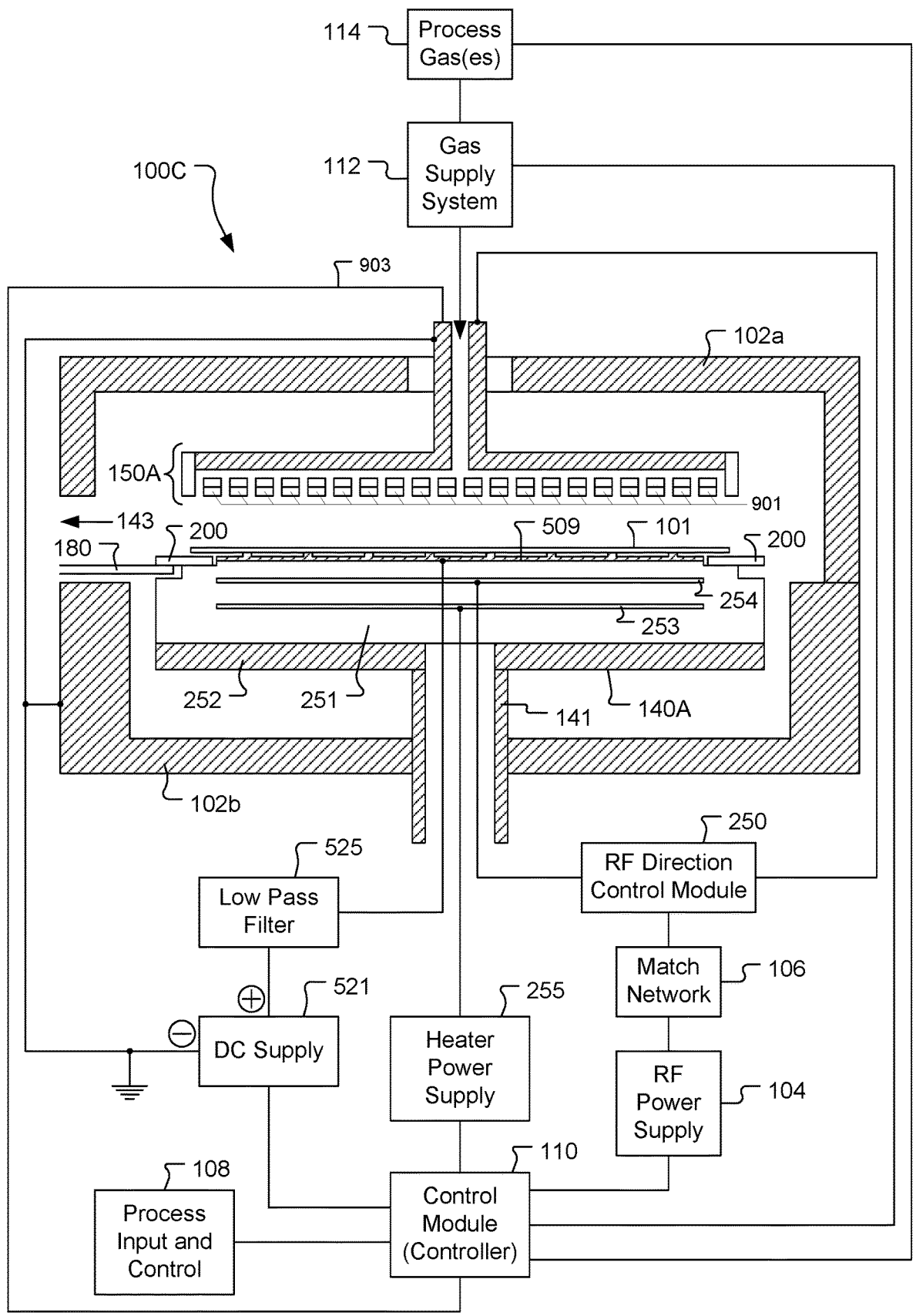
FIG. 9A shows a substrate processing system in which the method of FIG. 8 can be performed, in accordance with some embodiments of the present invention.

FIG. 9A shows a substrate processing system 100C in which the method of FIG. 8 can be performed, in accordance with some embodiments of the present invention. The substrate processing system 100C is a variation of the substrate processing system 100A of FIG. 1B. The substrate processing system 100C is an example of an apparatus for in-situ treatment of film surface defects during a plasma-based film deposition process. The substrate processing system 100C includes a substrate support, e.g., the pedestal 140A, having a top surface configured to support the substrate 101 during a plasma processing operation to deposit a film on the substrate 101. The substrate processing system 100C also includes an electrode, e.g., the showerhead electrode 150A and/or the RF electrode 254, disposed to transmit radiofrequency power into a plasma generation region overlying the substrate support. The substrate processing system 100C also includes a process gas delivery component, i.e., the showerhead electrode 150A, configured to deliver a process gas to the plasma generation region. The substrate processing system 100C also includes the exhaust outlet 143 configured to exhaust gases from the plasma generation region.

Additionally, the substrate processing system 100C includes a UV irradiation device 901 disposed to transmit UV radiation through the plasma generation region in a direction toward a top surface of the substrate support. Also, in the substrate processing system 100C, the control module 110 serves as a control system configured to direct generation of the plasma within the plasma generation region and direct operation of the UV irradiation device 901, such that generation of the plasma within the plasma generation region and transmission of UV radiation through the plasma generation region are performed in a successive manner without moving the substrate 101 from the top surface of the substrate support. In some embodiments, control signals are transmitted from the control module 110 to the UV irradiation device 901 through a signal conductor 903. In some embodiments, the control module 100 is configured to operate the substrate processing system 100C by executing process input and control instructions/programs 108 that are defined to direct generation of the plasma within the plasma generation region and transmission of UV radiation through the plasma generation region in a successive manner without moving the substrate 101 from the top surface of the substrate support.

Figure 9B:
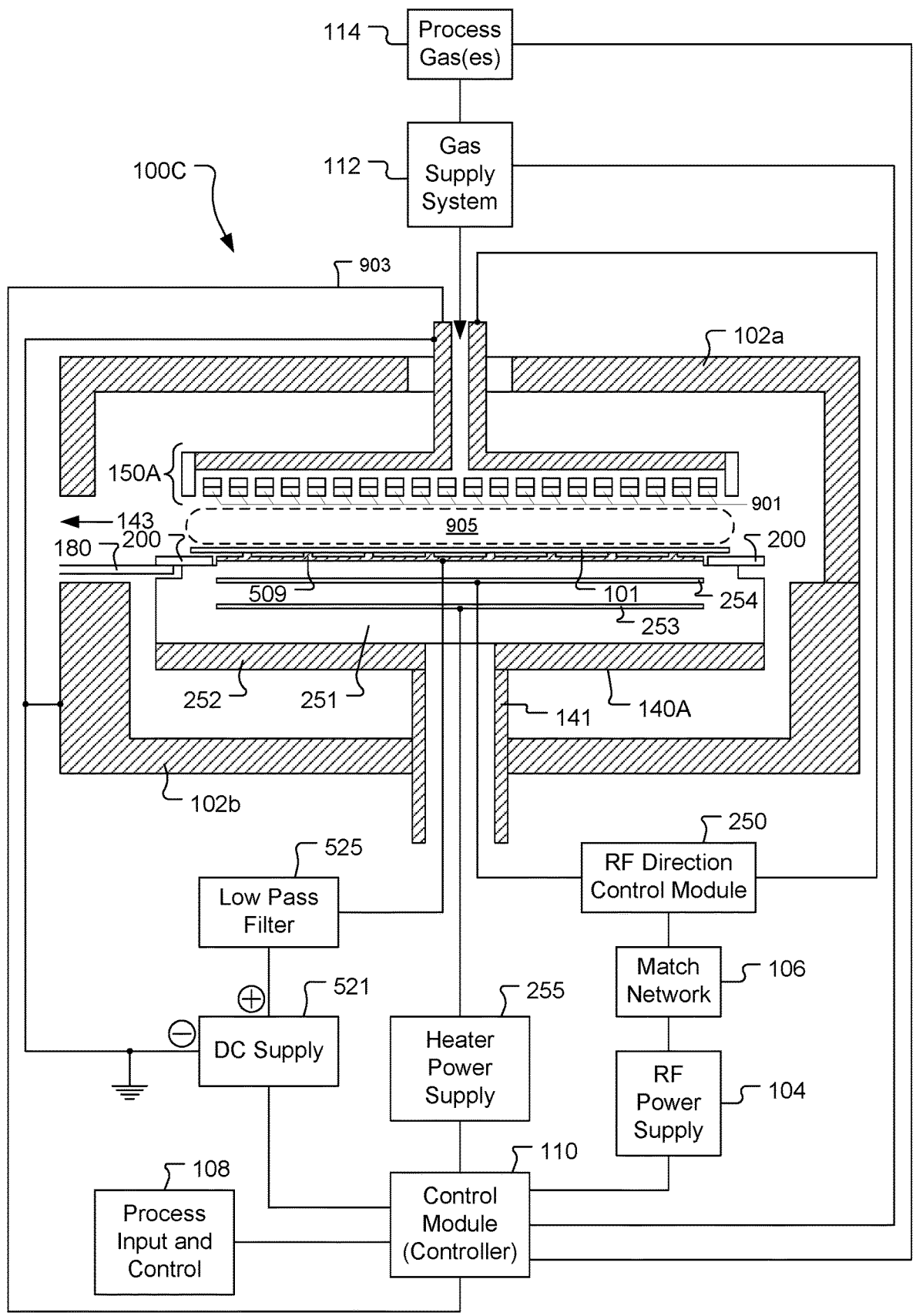
FIG. 9B shows the substrate processing system of FIG. 9A operating to generate a plasma within the plasma generation region overlying the substrate, in accordance with some embodiments of the present invention.
Figure 9C:
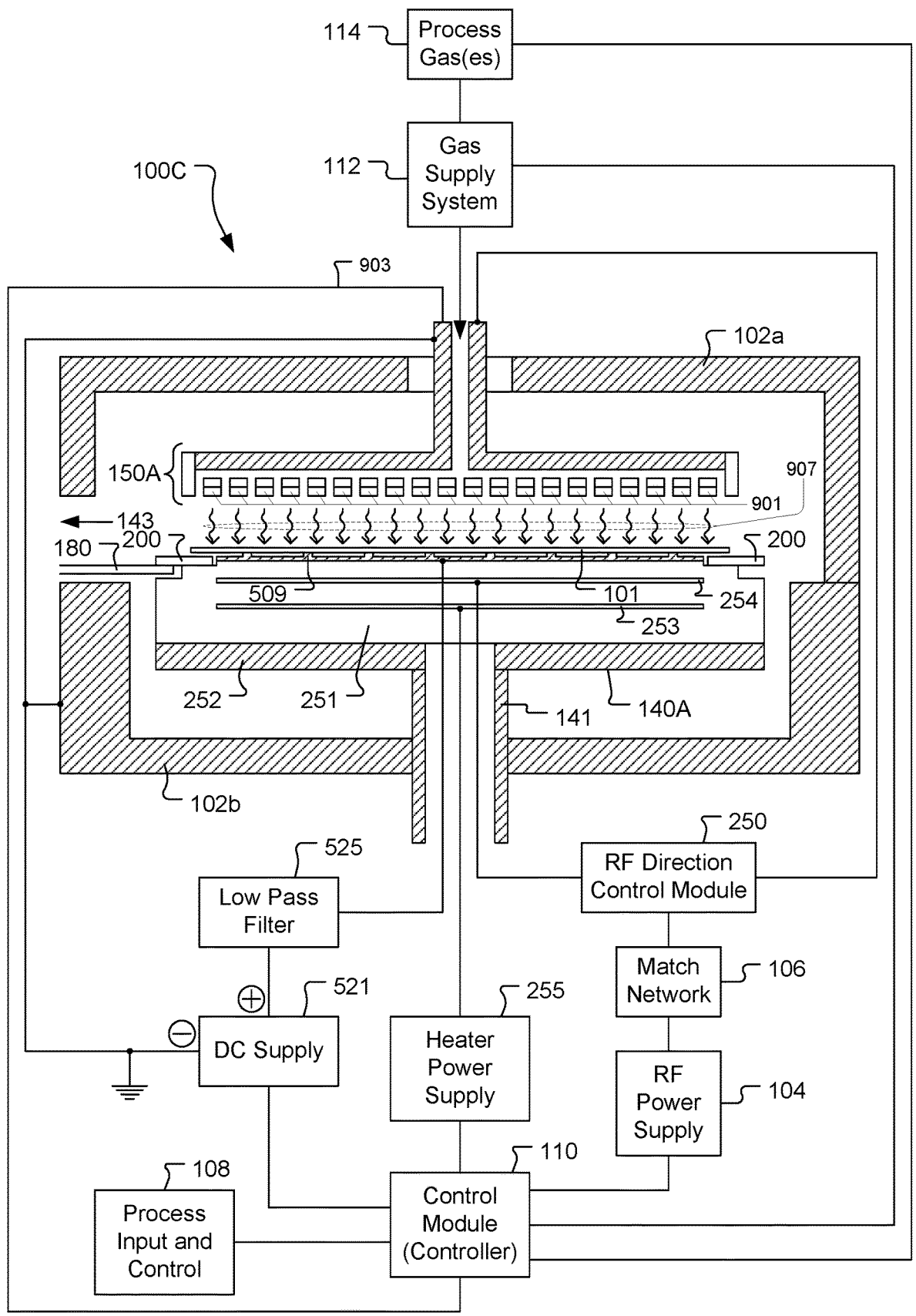
FIG. 9C shows the substrate processing system of FIG. 9A operating to generate and transmit ultraviolet radiation from the ultraviolet irradiation device through the plasma generation region toward the substrate, in accordance with some embodiments of the present invention.

FIG. 9B shows the substrate processing system 100C of FIG. 9A operating in accordance with operations 803 and 809 of the method of FIG. 8 to generate a plasma 905 within the plasma generation region overlying the substrate 101, in accordance with some embodiments of the present invention. FIG. 9C shows the substrate processing system 100C of FIG. 9A operating in accordance with operations 805 and 811 of the method of FIG. 8 to generate and transmit UV radiation from the UV irradiation device 901 through the plasma generation region toward the substrate 101, as indicated by the collection of arrows 907, in accordance with some embodiments of the present invention. It should be understood that the UV irradiation device 901 can include an arrangement of lenses and/or optical fibers for distribution and transmission of the UV radiation to the film deposited on the substrate 101. Also, it should be understood that in different embodiments the UV irradiation device 901 and its operation can have variations in photon energy and/or lamp configuration and/or ambient conditions. It should be appreciated that the systems and methods disclosed herein for suppressing plasma instabilities by using UV radiation to resolve defects within the deposited film adds a minimum perturbation to the plasma processing system.

The systems and methods disclosed herein provide an innovative UV radiation post treatment of conformal dielectric films in order to passivate/neutralize/correct oxygen vacancies and/or trapped charges within the deposited film so as to reduce secondary electron emission from the deposited film and correspondingly reduce formation of plasma instabilities, e.g., plasmoids. The systems and methods disclosed herein also provide for extension of the film deposition process window to higher power regimes, while maintaining use of argon-rich plasma and its associated beneficial argon ion bombardment, thereby leading to superior quality film deposition for future technology nodes.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for in-situ treatment of film surface defects during a plasma-based film deposition process, comprising:
   having an apparatus that includes a substrate support having a top surface configured to support a substrate during a plasma processing operation to deposit a film on the substrate, the apparatus including an electrode disposed to transmit radiofrequency power into a plasma generation region overlying the substrate support, the apparatus including a process gas delivery component configured to deliver a process gas to the plasma generation region, the apparatus including an exhaust outlet configured to exhaust gases from the plasma generation region, the apparatus including an ultraviolet irradiation device disposed to transmit ultraviolet radiation through the plasma generation region in a direction toward a top surface of the substrate support, the apparatus including a control system configured to direct generation of a plasma within the plasma generation region and direct operation of the ultraviolet irradiation device such that generation of the plasma within the plasma generation region and transmission of ultraviolet radiation through the plasma generation region are performed in a successive manner without moving the substrate from the top surface of the substrate support;
   a) positioning the substrate on the substrate support in exposure to the plasma generation region;
   b) operating the control system to direct generation of the plasma within the plasma generation region, the plasma configured to cause deposition of the film on the substrate, wherein the plasma is generated until the film deposited on the substrate reaches a threshold film thickness;
   c) operating the control system to direct performance of a film defect resolution operation upon the film deposited on the substrate reaching the threshold film thickness, the film defect resolution operation including stopping generation of the plasma and operating the ultraviolet irradiation device to transmit ultraviolet radiation through the plasma generation region toward the film on the substrate so that the ultraviolet radiation incident upon the substrate induces a reaction on the substrate to resolve defects within the film on the substrate;

d) operating the control system to complete the film defect resolution operation by stopping operation of the ultraviolet irradiation device;

e) operating the control system to direct further generation of the plasma within the plasma generation region until an interval thickness of the film deposited on the substrate reaches the threshold film thickness, wherein the interval thickness of the film corresponds to a thickness of the film deposited since a most recent completion of the film defect resolution operation;

f) operating the control system to direct repetition of the film defect resolution operation upon the interval thickness of the film deposited on the substrate reaching the threshold film thickness, repetition of the film defect resolution operation including stopping generation of the plasma and resuming operation of the ultraviolet irradiation device to transmit ultraviolet radiation through the plasma generation region toward the film on the substrate so that the ultraviolet radiation incident upon the substrate induces the reaction on the substrate to resolve defects within the film on the substrate; and g) operating the control system to direct repetition of operations d), e), and f) in a successive manner until the film deposited on the substrate reaches a secured film thickness.

2. The method as recited in claim 1, wherein the plasma is generated using a process gas composition of argon and oxygen.

3. The method as recited in claim 1, wherein the film deposited on the substrate is a silicon dioxide film.

4. The method as recited in claim 1, wherein exposing the substrate and film deposited on the substrate to the ultraviolet radiation in each of operations c) and f) is done in a continuous manner for a duration within a range extending from about 5 seconds to about 60 seconds.

5. The method as recited in claim 1, wherein the threshold film thickness is within a range extending up to about 75 angstroms, and wherein the secured film thickness is within a range greater than or equal to about 180 angstroms.

6. The method as recited in claim 1, wherein the defects within the film on the substrate include oxygen vacancies and/or trapped charges.

7. The method as recited in claim 1, wherein the reaction on the substrate induced by the ultraviolet radiation resolves defects within the film on the substrate through one or more processes of passivation and charge neutralization.

8. The method as recited in claim 1, further comprising: resuming generation of the plasma within the plasma generation region after the film deposited on the substrate reaches the secured film thickness and until the film deposited on the substrate reaches a total prescribed film thickness.

9. An apparatus for in-situ treatment of film surface defects during a plasma-based film deposition process, comprising:

a substrate support having a top surface configured to support a substrate during a plasma processing operation to deposit a film on the substrate;

an electrode disposed to transmit radiofrequency power into a plasma generation region overlying the substrate support;

a process gas delivery component configured to deliver a process gas to the plasma generation region;

an exhaust outlet configured to exhaust gases from the plasma generation region; and an ultraviolet irradiation device disposed to transmit ultraviolet radiation through the plasma generation region in a direction toward a top surface of the substrate support;

a control system configured to direct generation of the plasma within the plasma generation region and direct operation of the ultraviolet irradiation device such that generation of the plasma within the plasma generation region and transmission of ultraviolet radiation through the plasma generation region are performed in a successive manner without moving the substrate from the top surface of the substrate support, wherein the control system is configured to direct generation of the plasma within the plasma generation region until the film deposited on the substrate reaches a threshold film thickness, wherein the control system is configured to direct performance of a film defect resolution operation upon the film reaching the threshold film thickness, the film defect resolution operation including operation of the ultraviolet irradiation device to transmit ultraviolet radiation toward the film on the substrate so that the ultraviolet radiation induces a reaction on the substrate to resolve defects within the film on the substrate, wherein the control system is configured to direct further generation of the plasma within the plasma generation region upon completion of the film defect resolution operation and until an interval thickness of the film deposited on the substrate reaches the threshold film thickness, the interval thickness of the film corresponding to a thickness of the film deposited since a most recent completion of the film defect resolution operation, wherein the control system is configured to direct repetition of the film defect resolution operation and the further generation of the plasma within the plasma generation region in a successive manner until the film deposited on the substrate reaches a secured film thickness.

10. The apparatus as recited in claim 9, wherein the ultraviolet irradiation device is positioned above the substrate support.

11. The apparatus as recited in claim 10, wherein the ultraviolet irradiation device is configured to extend over an entirety of the top surface of the substrate support where the substrate is supported during the plasma processing operation.

12. The apparatus as recited in claim 9, wherein the ultraviolet irradiation device is electrically powered.

13. The apparatus as recited in claim 9, wherein the ultraviolet irradiation device includes an arrangement of lenses.

14. The apparatus as recited in claim 9, wherein the ultraviolet irradiation device includes an arrangement of optical fibers.

15. The apparatus as recited in claim 14, wherein the optical fibers are configured and connected to transmit ultraviolet radiation from an ultraviolet radiation source toward the top surface of the substrate support, and wherein the optical fibers are positioned to distribute the ultraviolet radiation across the top surface of the substrate support.

16. The apparatus as recited in claim 9, wherein the ultraviolet irradiation device is configured to direct ultraviolet radiation in a direction substantially perpendicular to the top surface of the substrate support.

17. The apparatus as recited in claim 9, wherein the electrode and the process gas delivery component are integrated into a showerhead electrode.

18. The apparatus as recited in claim 17, wherein the ultraviolet irradiation device is integrated into the showerhead electrode.

19. The apparatus as recited in claim 17, wherein the ultraviolet irradiation device is attached to a lower surface of the showerhead electrode that faces the top surface of the substrate support.

* * * * *